(12) United States Patent
Arasawa

(10) Patent No.: US 8,890,187 B2
(45) Date of Patent: Nov. 18, 2014

(54) LIGHT-EMITTING DEVICE WITH AN INSULATING PARTITION

(75) Inventor: Ryo Arasawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 328 days.

(21) Appl. No.: 13/085,734

(22) Filed: Apr. 13, 2011

(65) Prior Publication Data

US 2011/0254037 A1    Oct. 20, 2011

(30) Foreign Application Priority Data

Apr. 16, 2010  (JP) ................................. 2010-094807

(51) Int. Cl.
| | | |
|---|---|---|
| H01L 33/00 | (2010.01) | |
| H01L 29/04 | (2006.01) | |
| G02F 1/136 | (2006.01) | |
| H01L 51/52 | (2006.01) | |
| H01L 51/50 | (2006.01) | |
| H01L 27/32 | (2006.01) | |

(52) U.S. Cl.
CPC ........... *H01L 27/322* (2013.01); *H01L 27/3246* (2013.01); *H01L 27/3248* (2013.01); *H01L 51/5284* (2013.01); *H01L 51/5052* (2013.01); *H01L 51/5278* (2013.01)
USPC ................... 257/98; 257/40; 257/59; 257/72; 257/88; 257/89; 257/E33.06; 257/E33.061; 349/44; 349/106; 349/110; 345/55; 345/76

(58) Field of Classification Search
CPC .............. H01L 27/3211; H01L 27/322; H01L 27/3258; H01L 27/3248; H01L 2251/5392
USPC ........ 349/106, 110, 122, 138; 257/40, 59, 72, 257/88, 89, 98, E33.06, E33.061
See application file for complete search history.

(56) References Cited

U.S. PATENT DOCUMENTS

| | | | |
|---|---|---|---|
| 6,246,179 B1 * | 6/2001 | Yamada ...................... | 315/169.3 |
| 6,429,916 B1 | 8/2002 | Nakata et al. | |
| 6,784,457 B2 | 8/2004 | Yamazaki et al. | |
| 6,856,360 B1 * | 2/2005 | Higuchi et al. ................. | 349/43 |
| 6,933,520 B2 | 8/2005 | Yamazaki | |
| 7,397,180 B2 | 7/2008 | Yamazaki | |

(Continued)

FOREIGN PATENT DOCUMENTS

| | | |
|---|---|---|
| JP | 9-90425 | 4/1997 |
| JP | 10-10574 | 1/1998 |
| JP | 2000-231123 | 8/2000 |
| JP | 2004-227584 | 8/2004 |

*Primary Examiner* — Jesse Y Miyoshi
(74) *Attorney, Agent, or Firm* — Husch Blackwell LLP

(57) ABSTRACT

A low-power light-emitting device which can be manufactured in simple steps and is suitable for increasing definition and the size of a substrate is provided. The light-emitting device includes a layer for blocking visible light; a conductive layer that partly overlaps with the layer for blocking visible light; a color filter layer that includes an opening over the layer for blocking visible light; a first electrode layer for transmitting visible light that is connected to the conductive layer through the opening, over the color filter layer; an insulating partition over the first electrode layer overlapping with the opening; a layer containing an organic compound over the first electrode layer and the partition; and a second electrode layer over the layer containing an organic compound. The layer containing an organic compound includes a layer containing a donor substance and an acceptor substance and a layer containing a light-emitting organic compound.

12 Claims, 10 Drawing Sheets

(56) References Cited

U.S. PATENT DOCUMENTS

| | | |
|---|---|---|
| 7,821,065 B2 | 10/2010 | Murakami et al. |
| 7,851,797 B2 | 12/2010 | Yamazaki et al. |
| 2001/0019133 A1* | 9/2001 | Konuma et al. ................ 257/79 |
| 2004/0251814 A1 | 12/2004 | Nishikawa et al. |
| 2007/0001587 A1* | 1/2007 | Hatwar et al. ................ 313/504 |
| 2007/0164664 A1* | 7/2007 | Ludwicki et al. ............ 313/504 |

\* cited by examiner

LIGHT-EMITTING DEVICE WITH AN INSULATING PARTITION

BACKGROUND OF THE INVENTION

1. Field of the Invention

The present invention relates to light-emitting devices and electronic devices including layers containing organic compounds as light-emitting layers.

2. Description of the Related Art

Light-emitting elements including organic compounds as luminous bodies, which have features of thinness, lightness, high-speed response to input signals, and DC drive at low power supply voltage, have been expected to be applied to next-generation flat panel displays or lighting devices. In particular, display devices in which light-emitting elements are arranged in matrix have been considered to have advantages of a wide viewing angle and high visibility over conventional liquid crystal display devices.

The emission mechanism of a light-emitting element including an organic compound as a luminous body is as follows. First, when voltage is applied between a pair of electrodes with an electroluminescence (hereinafter also referred to as EL) layer provided therebetween, electrons injected from a cathode and holes injected from an anode are injected into the EL layer, so that current flows. Then, the injected electrons and holes bring the light-emitting organic compound included in the EL layer into an excited state, so that light is emitted from the excited light-emitting organic compound. Singlet excitation and triplet excitation are known as excited states, and light can be emitted through either state.

An EL layer included in a light-emitting element includes at least a light-emitting layer. The EL layer can further have a layered structure including a hole injection layer, a hole transport layer, an electron transport layer, an electron injection layer, and/or the like, in addition to the light-emitting layer.

In the case where a device for displaying full-color images is manufactured, it is necessary to arrange light-emitting elements which emit lights of at least three colors of red, green, and blue in matrix. As a method for obtaining lights of at least three colors of red, green, and blue, there are a method by which necessary portions of EL layers are colored separately and light-emitting elements emitting lights of different colors are provided (hereinafter such a method is referred to as a separate coloring method), a method by which each color is obtained by formation of all the light-emitting elements that emit white light and transmission of the white light through a color filter (hereinafter such a method is referred to as a color filter method), a method by which each color is obtained by formation of all the light-emitting elements that emit blue light or light of a color with a shorter wavelength than that of blue and transmission of the blue light through a color conversion layer (hereinafter such a method is referred to as a color conversion method), and the like. For example, Reference 1 discloses an organic EL display device with a color filter method.

The separate coloring method has many technical problems such as low material use efficiency and difficulty in the increase in yields; thus, it is difficult to increase definition or the size of a substrate. In contrast, the color filter method and the color conversion method facilitate manufacturing steps as compared to the separate coloring method; thus, it is easy to increase definition or the size of a substrate.

REFERENCE

Reference 1: Japanese Published Patent Application No. 2004-227854

SUMMARY OF THE INVENTION

However, power consumption in the color filter method is higher than that in the separate coloring method because light is absorbed by a color filter, which is problematic. In addition, power consumption in the color conversion method is higher than that in the separate coloring method because color conversion efficiency is not always 100%, which is problematic.

It is therefore an object of one embodiment of the present invention to provide a low-power light-emitting device which can be manufactured in simple steps and is suitable for increasing definition and the size of a substrate. Further, it is an object of one embodiment of the present invention to provide an electronic device including the light-emitting device.

In order to achieve the objects, the drive voltage of a light-emitting element used in the light-emitting device is lowered. Specifically, in the light-emitting element including an electrode layer on the substrate side (hereinafter referred to as a first electrode layer), a second electrode layer, and an EL layer, the EL layer includes a highly-conducting layer and a layer containing a light-emitting organic compound. Examples of the highly-conducting layer include a layer which transmits visible light and contains a highly-conducting substance (e.g., an alloy of indium oxide and tin oxide ($In_2O_3$—$SnO_2$ (ITO)) and a layer which contains a donor substance and an acceptor substance. As the layer which contains a donor substance and an acceptor substance, specifically, a layer in which an alkali metal, an alkaline earth metal, a rare earth metal, an alkali metal compound, an alkaline earth metal compound, or a rare earth metal compound is added to an organic compound, or a layer containing a conductive polymer such as poly(3,4-ethylenedioxythiophene)/poly(styrenesulfonic acid) (PEDOT/PSS) can be used. Provision of the highly-conducting layer as part of the EL layer makes the drive voltage of the light-emitting element lower. A low-power light-emitting device can be realized using the light-emitting element with low drive voltage.

Further, a method by which a color filter or a color conversion layer is formed between a first electrode layer of a light-emitting element and a substrate is employed among color filter methods and color conversion methods. With this method, after a highly-conducting wiring is formed over the substrate, the color filter or the color conversion layer may be formed successively. This method can facilitate manufacturing steps and reduce cost as compared to a method by which a substrate provided with a color filter is attached to a substrate provided with a light-emitting element over a highly-conducting wiring.

Specifically, a light-emitting device with a structure where a transistor is formed over the same substrate as a light-emitting element, as a switching element of the light-emitting element, and a first electrode layer of the light-emitting element is connected to a source electrode layer or a drain electrode layer of the transistor (i.e., an active-matrix light-emitting device) is employed. The active-matrix light-emitting device facilitates improvement in image quality of the light-emitting device and reduction in power consumption.

In the case where a color filter layer is formed between the first electrode layer of the light-emitting element and the substrate, an opening is provided in the color filter layer and it is necessary to connect the color filter layer to a highly-conducting wiring over the substrate through part of the opening. In particular, in the active-matrix light-emitting device, it is necessary that an electrode layer of a pixel transistor and the first electrode layer of the light-emitting element be connected to each other in the opening. Note that in order that an EL layer which overlaps with the opening in the color filter layer does not emit light, in the opening, an insulating partition is provided over the first electrode layer and the EL layer and a second electrode layer are formed over the partition. With this structure, light which does not transmit through the color filter layer can be prevented from leaking to a viewer side when the EL layer which overlaps with the opening emits light. As described above, however, a highly-conducting layer is used as an EL layer in a light-emitting device of one embodiment of the present invention; thus, current flows through an insulating partition via the highly-conducting layer. Consequently, the EL layer also emits light over the partition provided in the opening in the color filter layer. If light which does not transmit through the color filter layer leaks through the opening in the color filter layer, the color range of the entire light-emitting device decreases, which is problematic. Such a problem can be therefore solved when the insulating partition is formed using a material for blocking visible light or when a layer for blocking visible light is provided between the EL layer and the substrate in the opening in the color filter layer.

In this specification, a color filter is a layer which transmits light in a specific wavelength range and includes a color filter with which each color can be obtained by transmission of white light and a color conversion layer with which each color can be obtained by transmission of blue light.

One embodiment of the present invention is therefore a light-emitting device which includes a layer for blocking visible light; a conductive layer that partly overlaps with the layer for blocking visible light; a color filter layer that includes an opening over the layer for blocking visible light; a first electrode layer for transmitting visible light that is connected to the conductive layer through the opening, over the color filter layer; an insulating partition over the first electrode layer overlapping with the opening; a layer containing an organic compound over the first electrode layer and the partition; and a second electrode layer over the layer containing an organic compound. The layer containing an organic compound includes a layer containing a donor substance and an acceptor substance and a layer containing a light-emitting organic compound.

One embodiment of the present invention is a light-emitting device which includes a layer for blocking visible light; a conductive layer for blocking visible light that partly overlaps with the layer for blocking visible light; a color filter layer that includes an opening over the layer for blocking visible light and the conductive layer; a first electrode layer for transmitting visible light that is connected to the conductive layer through the opening, over the color filter layer; an insulating partition over the first electrode layer overlapping with the opening; a layer containing an organic compound over the first electrode layer and the partition; and a second electrode layer over the layer containing an organic compound. The layer containing an organic compound includes a layer containing a donor substance and an acceptor substance and a layer containing a light-emitting organic compound.

One embodiment of the present invention is a light-emitting device which includes a conductive layer for blocking visible light; a color filter layer that includes an opening over the conductive layer; a first electrode layer for transmitting visible light that is connected to the conductive layer through the opening, over the color filter layer; an insulating partition over the first electrode layer overlapping with the opening; a layer containing an organic compound over the first electrode layer and the partition; and a second electrode layer over the layer containing an organic compound. The layer containing an organic compound includes a layer containing a donor substance and an acceptor substance and a layer containing a light-emitting organic compound.

In a light-emitting device with the above structure, it is preferable that the conductive layer be electrically connected to a transistor.

The conductive layer for blocking visible light may also serve as a gate electrode layer, a source electrode layer, or a drain electrode layer of the transistor. Further, the conductive layer for blocking visible light may be formed using the same conductive film as the gate electrode layer, the source electrode layer, or the drain electrode layer of the transistor.

In the light-emitting device with the above structure, the layer containing an organic compound may include a first layer including a layer containing a light-emitting organic compound, a second layer including a layer containing a light-emitting organic compound, and an intermediate layer provided between the first layer and the second layer. In such a case, the intermediate layer is preferably a highly-conducting layer containing a donor substance and an acceptor substance.

In the light-emitting device with the above structure, an alkali metal, an alkaline earth metal, a rare earth metal, an alkali metal compound, an alkaline earth metal compound, or a rare earth metal compound is preferably contained as the donor substance because the conductivity of the layer containing an organic compound is increased.

An electronic device including the light-emitting device with the above structure is also included in the present invention.

According to one embodiment of the present invention, it is possible to provide a low-power light-emitting device which can be manufactured in simple steps and is suitable for increasing definition and the size of a substrate. Further, according to one embodiment of the present invention, it is possible to provide an electronic device including the light-emitting device.

DETAILED DESCRIPTION OF THE INVENTION

Figure 1:
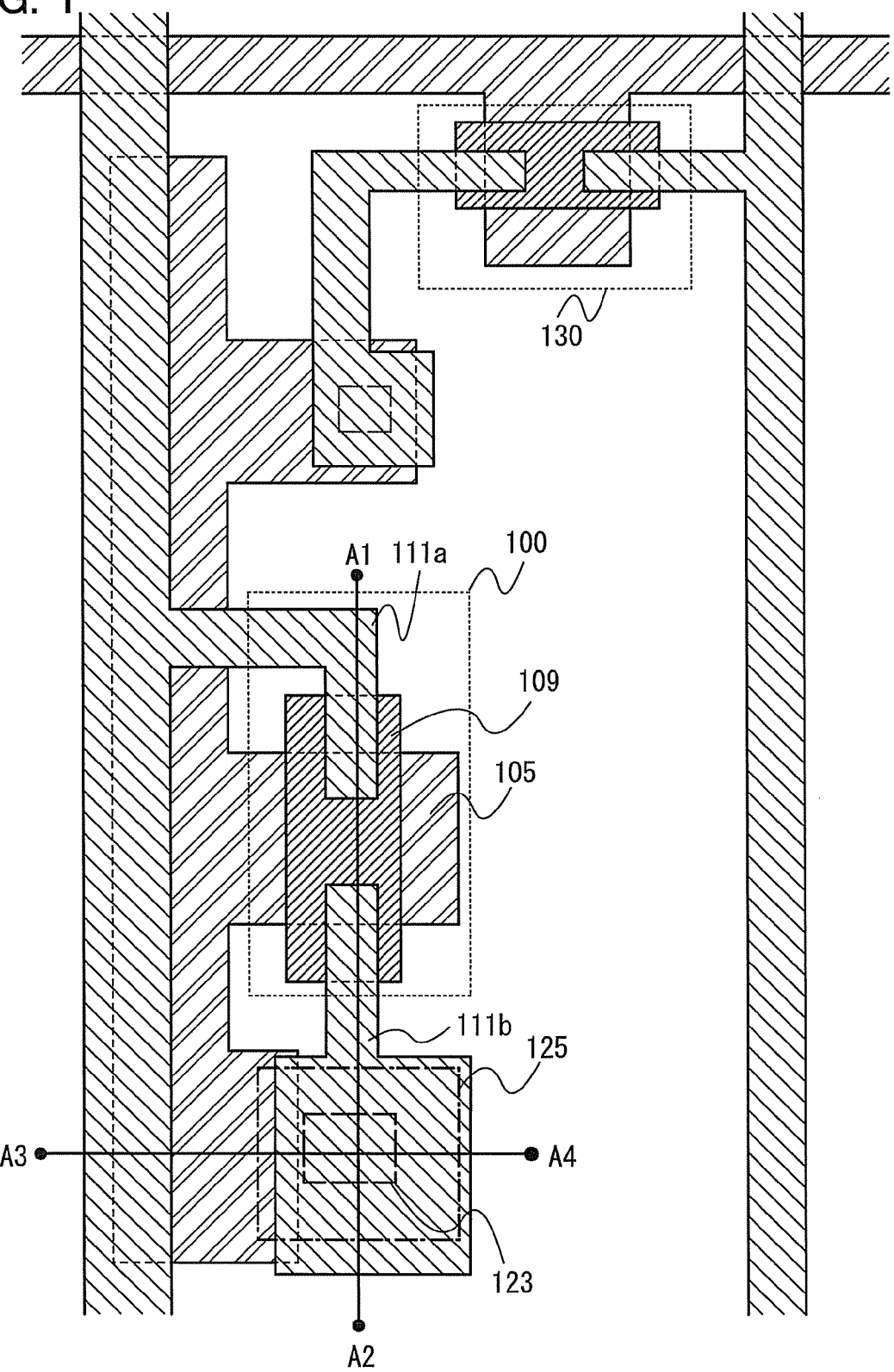
FIG. 1 is a top view illustrating a structure of a light-emitting device in an embodiment.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures described below, the same portions or portions having similar functions are denoted by common reference numerals in different drawings, and description thereof is not repeated.

Embodiment 1

In this embodiment, a light-emitting device in one embodiment of the present invention is described with reference to FIG. 1, FIG. 2, FIGS. 3A and 3B, FIGS. 4A and 4B, and FIG. 5.

Figure 2:
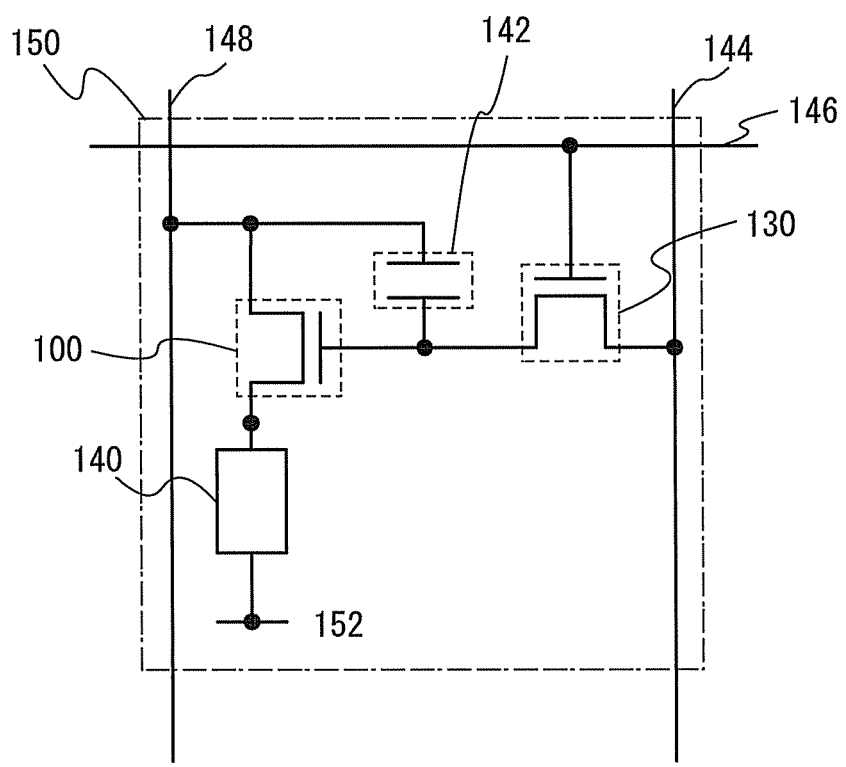
FIG. 2 illustrates an equivalent circuit of the light-emitting device in the embodiment.

FIG. 1 is the top view of a pixel portion of the light-emitting device in one embodiment of the present invention. The light-emitting device illustrated in FIG. 1 includes a drive transistor 100 and a switching transistor 130. The drive transistor 100 includes a gate electrode layer 105, an oxide semiconductor layer 109 that is a semiconductor layer, and a source and drain electrode layers 111a and 111b. FIG. 2 corresponds to an equivalent circuit of a circuit of the pixel portion illustrated in FIG. 1.

FIG. 2 illustrates an example of a pixel structure of the light-emitting device in one embodiment of the present invention to which digital time-ratio grayscale driving can be applied.

The structure and operation of a pixel to which digital time-ratio grayscale driving can be applied are described. Here, one pixel includes two n-channel transistors each having an oxide semiconductor layer as a channel formation region.

A pixel 150 includes the switching transistor 130, the drive transistor 100, a light-emitting element 140, and a capacitor 142. A gate of the switching transistor 130 is connected to a scan line 146. A first electrode (one of a source electrode and a drain electrode) of the switching transistor 130 is connected to a signal line 144. A second electrode (the other of the source electrode and the drain electrode) of the switching transistor 130 is connected to a gate of the drive transistor 100. The gate of the drive transistor 100 is connected to a power supply line 148 through the capacitor 142. A first electrode of the drive transistor 100 is connected to the power supply line 148. A second electrode of the drive transistor 100 is connected to a first electrode (a pixel electrode) of the light-emitting element 140. A second electrode of the light-emitting element 140 corresponds to a common electrode 152. The common electrode 152 is electrically connected to a common potential line formed over one substrate.

Note that the second electrode (the common electrode 152) of the light-emitting element 140 is set to a low power supply potential. Note that the low power supply potential is a potential satisfying a relationship, the low power supply potential<a high power supply potential, with reference to the high power supply potential which is set to the power supply line 148. As the low power supply potential, GND, 0 V, or the like may be employed, for example. A difference between the high power supply potential and the low power supply potential is applied to the light-emitting element 140 and current flows to the light-emitting element 140, so that the light-emitting element 140 emits light. Thus, each potential is set so that the difference between the high power supply potential and the low power supply potential is higher than or equal to the forward threshold voltage of the light-emitting element 140.

Note that gate capacitance of the drive transistor 100 may be used as a substitute for the capacitor 142, so that the capacitor 142 can be eliminated. The gate capacitance of the drive transistor 100 may be formed between a channel region and the gate.

Here, in the case of a voltage-input voltage driving method, a video signal is input to the gate of the drive transistor 100 so that the drive transistor 100 is sufficiently turned on or turned off. That is, the drive transistor 100 operates in a linear region. Since the drive transistor 100 operates in the linear region, voltage which is higher than the voltage of the power supply line 148 is applied to the gate of the drive transistor 100. Note that voltage which is higher than or equal to (the voltage of the power supply line+the threshold voltage $V_{th}$ of the drive transistor 100) is applied to the signal line 144.

In the case where analog grayscale driving is performed instead of the digital time-ratio grayscale driving, the same pixel structure as in FIG. 2 can be used by input of different signals.

In the case where analog grayscale driving is performed, voltage which is higher than or equal to (the forward voltage of the light-emitting element 140+$V_{th}$ of the drive transistor 100) is applied to the gate of the drive transistor 100. The forward voltage of the light-emitting element 140 is voltage at which desired luminance is obtained and is higher than at least forward threshold voltage. Note that a video signal by which the drive transistor 100 operates in a saturation region is input, so that current can flow to the light-emitting element 140. In order to operate the drive transistor 100 in the saturation region, the potential of the power supply line 148 is set higher than the gate potential of the drive transistor 100. When an analog video signal is used as a video signal, current corresponding to the video signal can flow to the light-emitting element 140, and the analog grayscale driving can be performed.

Note that the pixel structure is not limited to the pixel structure illustrated in FIG. 2. For example, the pixel illustrated in FIG. 2 may further include a switch, a resistor, a capacitor, a transistor, a logic circuit, or the like.

Figure 3A:
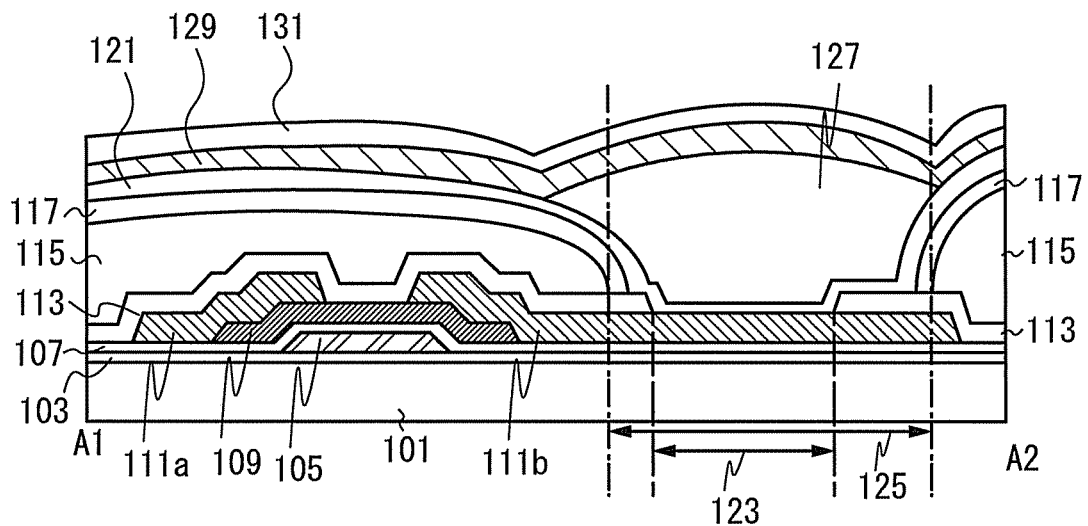
FIGS. 3A and 3B are cross-sectional views each illustrating a structure of the light-emitting device in the embodiment.
Figure 4A:
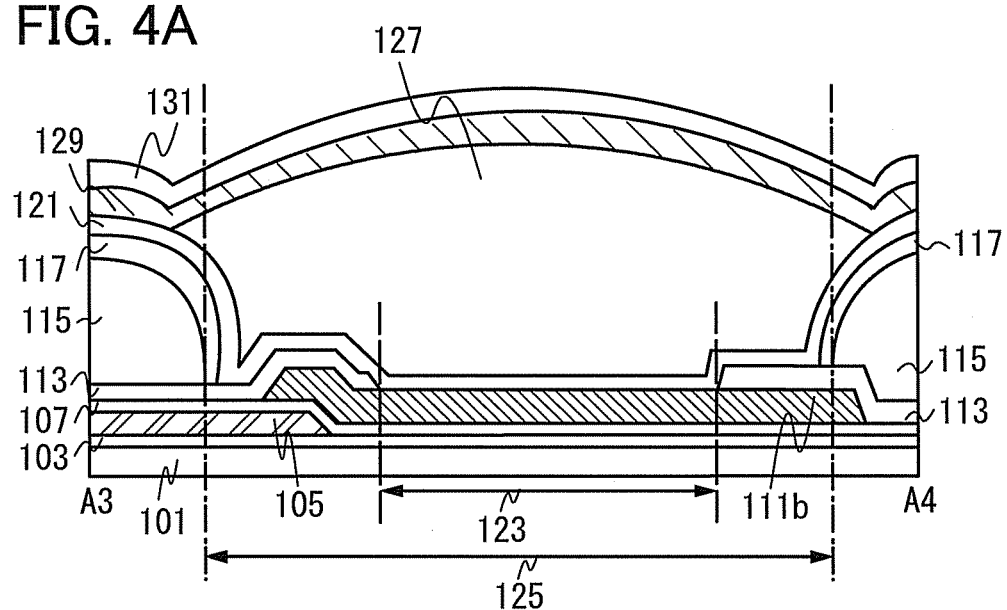
FIGS. 4A and 4B are cross-sectional views each illustrating a structure of the light-emitting device in the embodiment.

The detailed structure of the pixel in the light-emitting device in one embodiment of the present invention is described with reference to FIG. 3A and FIG. 4A. FIG. 3A corresponds to a cross section taken along section line A1-A2 in FIG. 1. FIG. 4A corresponds to a cross section taken along section line A3-A4 in FIG. 1.

The light-emitting device illustrated in FIG. 3A and FIG. 4A includes a substrate 101 for transmitting visible light, a base layer 103, the gate electrode layer 105, a gate insulating layer 107, the oxide semiconductor layer 109 that is a semiconductor layer, the source and drain electrode layers 111a and 111b, an interlayer insulating layer 113, a color filter layer 115, an overcoat layer 117, a first electrode layer 121, an insulating partition 127, an EL layer 129, and a second electrode layer 131.

There is no particular limitation on a semiconductor material used for the semiconductor layer in the light-emitting device in one embodiment of the present invention. For example, any of the following materials can be used: silicon-based semiconductor materials (which may be amorphous, crystalline, or single crystal), germanium-based semiconductor materials, chalcogenide-based semiconductor materials, oxide semiconductor materials, or other variety of semiconductor materials. The light-emitting device in this embodiment includes the oxide semiconductor layer 109 as a semiconductor layer. In this embodiment, an oxide semiconductor which is made to be an intrinsic (i-type) or substantially intrinsic semiconductor by removal of impurities is used. Note that there is no particular limitation on the crystallinity of a semiconductor used for the semiconductor layer, and an amorphous semiconductor or a crystalline semiconductor may be used.

The color filter layer 115 includes an opening 125. A contact portion 123 where the first electrode layer 121 and the source electrode layer (or the drain electrode layer) 111b are connected to each other is included in the opening 125. The partition 127 is provided over the first electrode layer 121 overlapping with the opening 125.

The gate electrode layer 105 and the source electrode layer (or the drain electrode layer) 111b are formed using materials for blocking visible light. These layers for blocking visible light can block light emitted from the EL layer 129 overlapping with the opening 125.

The EL layer 129 includes a highly-conducting layer and a layer containing a light-emitting organic compound. Current therefore flows through the partition 127 via the highly-conducting layer. Consequently, the EL layer also emits light over the partition 127. That is, the EL layer emits light in a region of the color filter layer 115 that overlaps with the opening 125. When light which does not transmit through the color filter layer 115 leaks through the opening 125, the color range of the entire light-emitting device decreases, which is problematic. In the light-emitting device in this embodiment, however, such a problem can be prevented because in the opening 125, the gate electrode layer 105 and the source electrode layer (or the drain electrode layer) 111b are provided between the EL layer 129 and the substrate 101. Note that the highly-conducting layer and the layer containing a light-emitting organic compound are not necessarily in direct contact with each other. A different layer may be provided between these two layers.

Figure 5:
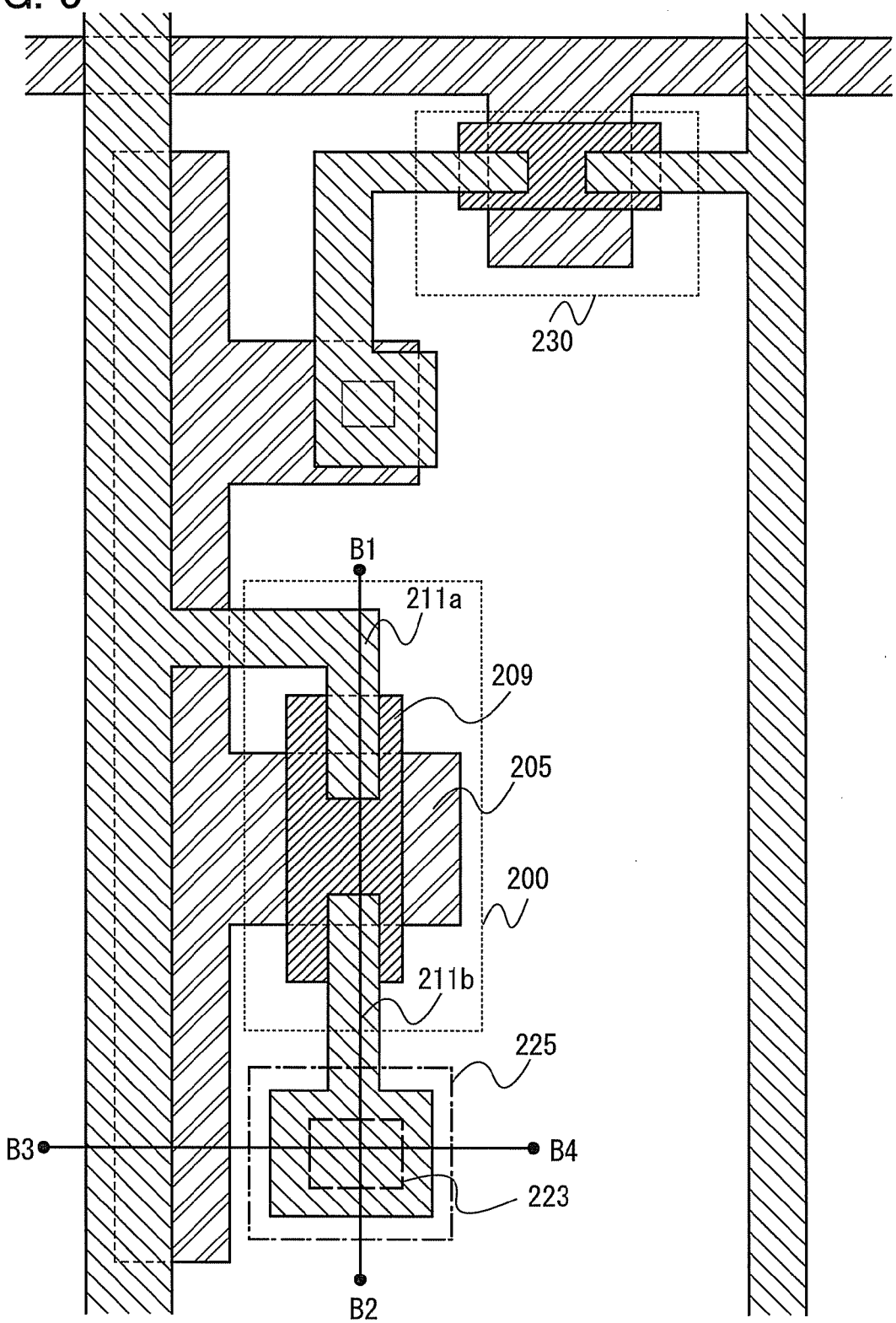
FIG. 5 is a top view illustrating a structure of the light-emitting device in the embodiment.

FIG. 5 is the top view of a pixel portion of the light-emitting device in one embodiment of the present invention that is different from the pixel portion in FIG. 1. The light-emitting device in one embodiment of the present invention that is illustrated in FIG. 5 includes a drive transistor 200 and a switching transistor 230. The drive transistor 200 includes a gate electrode layer 205, a semiconductor layer 209, and a source and drain electrode layers 211a and 211b.

Figure 3B:
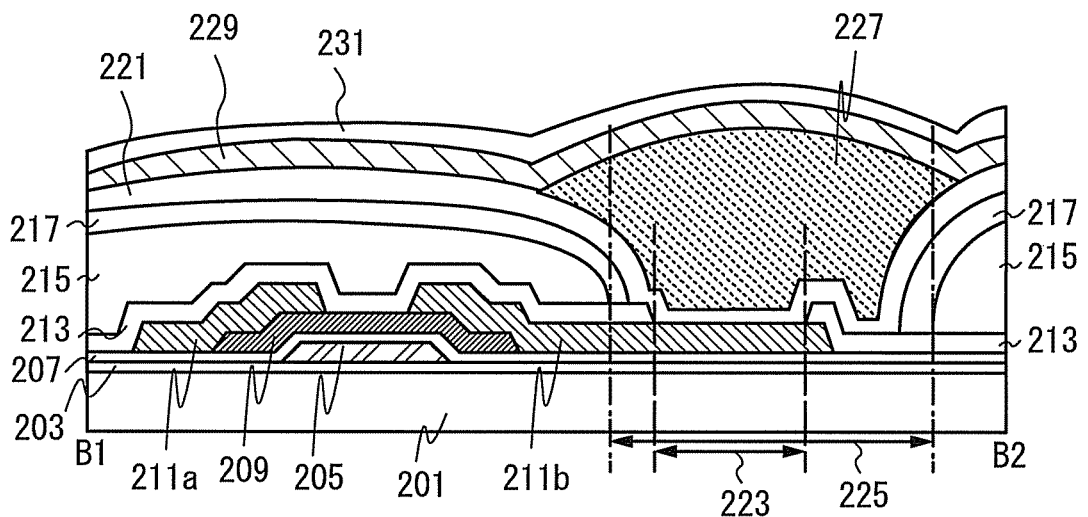
Figure 4B:
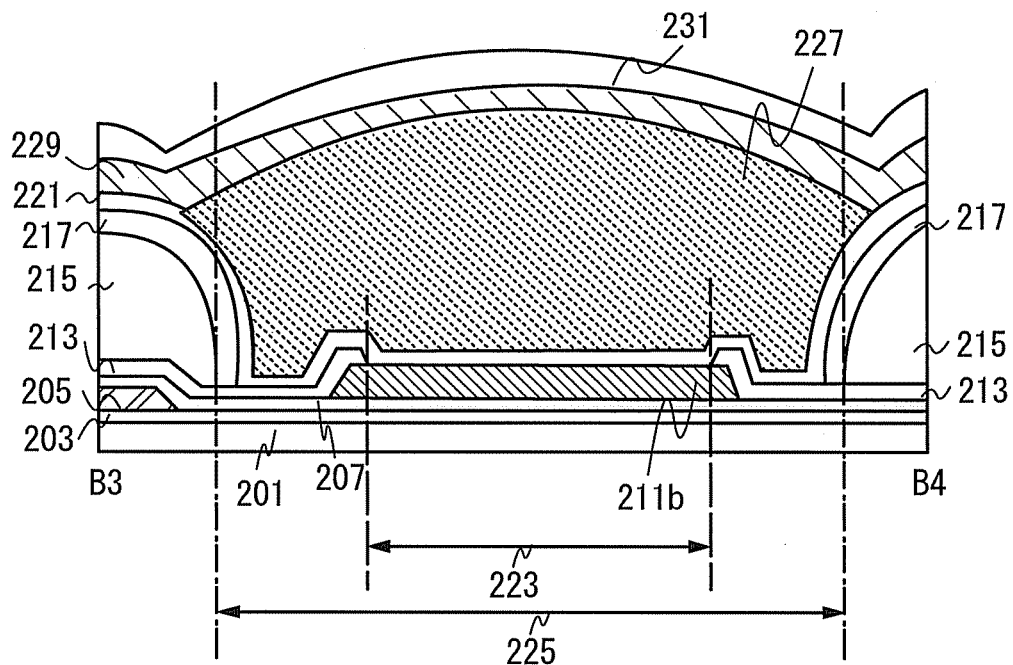

The detailed structure of the pixel in the light-emitting device in one embodiment of the present invention is described with reference to FIG. 3B and FIG. 4B. FIG. 3B corresponds to a cross section taken along section line B1-B2 in FIG. 5. FIG. 4B corresponds to a cross section taken along section line B3-B4 in FIG. 5.

The light-emitting device illustrated in FIG. 3B and FIG. 4B includes a substrate 201 for transmitting visible light, a base layer 203, the gate electrode layer 205, a gate insulating layer 207, the semiconductor layer 209, the source and drain electrode layers 211a and 211b, an interlayer insulating layer 213, a color filter layer 215, an overcoat layer 217, a first electrode layer 221, an insulating partition 227 for blocking visible light, an EL layer 229, and a second electrode layer 231.

The color filter layer 215 includes an opening 225. A contact portion 223 where the first electrode layer 221 and the source electrode layer (or the drain electrode layer) 211b are connected to each other is included in the opening 225. The partition 227 is provided over the first electrode layer 221 overlapping with the opening 225.

The EL layer 229 includes a highly-conducting layer and a layer containing a light-emitting organic compound. Current therefore flows through the partition 227 via the highly-conducting layer. Consequently, the EL layer also emits light over the partition 227. That is, the EL layer emits light in a region of the color filter layer 215 that overlaps with the opening 225. When light which does not transmit through the color filter layer 215 leaks through the opening 225, the color range of the entire light-emitting device decreases, which is problematic. However, the partition 227 in the light-emitting device in this embodiment blocks visible light; thus, such a problem can be prevented.

As described above, in the light-emitting device in this embodiment, provision of the highly-conducting layer as the EL layer makes the drive voltage of the light-emitting element lower. A low-power light-emitting device can be realized using the light-emitting element with low drive voltage.

In addition, since the color filter layer is provided between the first electrode layer of the light-emitting element and the substrate, the color filter layer can be formed successively after a highly-conducting wiring is formed over the substrate. Thus, manufacturing steps can be facilitated and cost can be reduced.

In the light-emitting device in this embodiment, by provision of a partition for blocking visible light over the first electrode layer overlapping with the opening in the color filter layer or provision of the layer for blocking visible light that overlaps with the opening in the color filter layer between the EL layer and the substrate, light which does not transmit through the color filter layer can be prevented from leaking through the opening in the color filter layer, so that the decrease in the color range of the entire light-emitting device can be prevented.

Embodiment 2

Figure 6A:
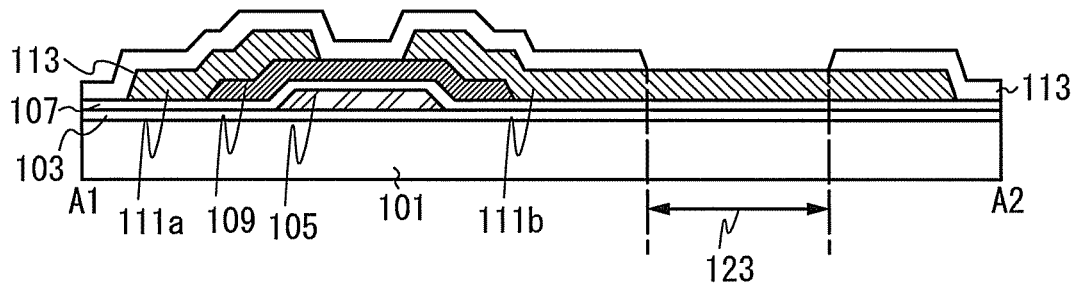
FIGS. 6A to 6C illustrate a method for manufacturing a light-emitting device in an embodiment.
Figure 6B:
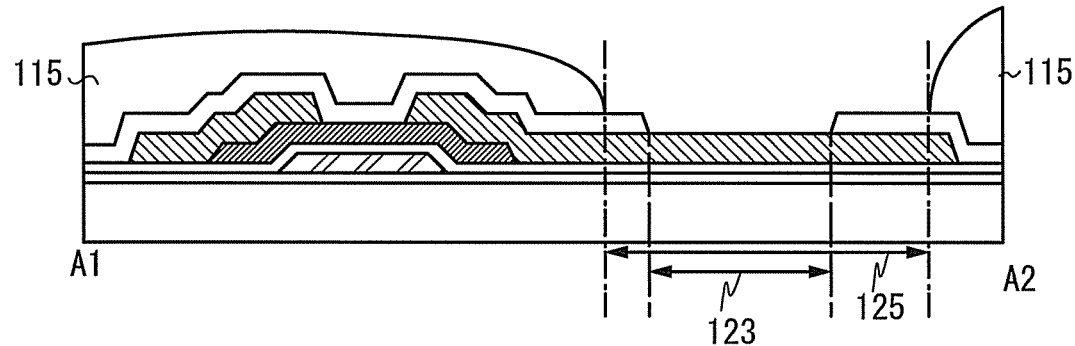

In this embodiment, an example of a method for manufacturing the light-emitting device in Embodiment 1 is described with reference to FIGS. 6A to 6C.

First, the base layer 103 is formed over the substrate 101 for transmitting visible light. Since the substrate 101 is positioned in a direction in which light from the EL layer is extracted, a material for transmitting visible light, for example, glass such as barium borosilicate glass or aluminoborosilicate glass, plastics, a polyester film, or an acrylic film is used for the substrate 101. The base layer 103 has a function of preventing diffusion of impurities from the substrate 101; however, the base layer 103 is not necessarily provided. The base layer can be formed to have a single-layer structure or a layered structure including a silicon nitride film, a silicon oxide film, a silicon nitride oxide film, and a silicon oxynitride film.

First, a conductive film is formed over the base layer 103. Then, the gate electrode layer 105 is formed through a first photolithography process. Note that a resist mask may be formed by an inkjet method. When the resist mask is formed by an inkjet method, a photomask is not used; thus, manufacturing cost can be reduced.

The gate electrode layer 105 can be formed to have a single-layer structure or a layered structure including a metal material such as molybdenum, titanium, tantalum, tungsten, aluminum, copper, neodymium, or scandium; or an alloy material which contains the metal material as its main component.

Then, the gate insulating layer 107 is formed over the gate electrode layer 105. The gate insulating layer 107 can be formed to have a single-layer or a layered structure including a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by plasma-enhanced CVD, sputtering, or the like.

In the light-emitting device in this embodiment, the oxide semiconductor layer 109 is formed as a semiconductor layer. An oxide semiconductor which is made to be an intrinsic (i-type) or substantially intrinsic semiconductor by removal of impurities is used as an oxide semiconductor in this embodiment. Such a highly purified oxide semiconductor is highly sensitive to an interface state and interface charge; thus, an interface between the oxide semiconductor layer and the gate insulating layer is important. Thus, the gate insulating layer which is in contact with the highly purified oxide semiconductor needs high quality.

For example, high-density plasma-enhanced CVD using microwaves (e.g., a frequency of 2.45 GHz) is preferable because a dense high-quality insulating layer with high withstand voltage can be formed. This is because the interface state can be reduced and interface properties can be favorable when the highly purified oxide semiconductor is closely in contact with the high-quality gate insulating layer.

Needless to say, a different deposition method can be used as long as a high-quality insulating layer can be formed as the gate insulating layer. In addition, any gate insulating layer can be used as long as film quality and properties of an interface with an oxide semiconductor of the gate insulating layer are modified by heat treatment performed after deposition. In either case, any gate insulating layer can be used as long as film quality as a gate insulating layer is high, interface state density with an oxide semiconductor is decreased, and a favorable interface can be formed.

Note that in order that hydrogen, a hydroxyl group, and moisture are contained in the gate insulating layer 107 and an oxide semiconductor film as little as possible, it is preferable that as pretreatment for the deposition of the oxide semiconductor film, the substrate 101 over which the gate electrode layer 105 or the gate insulating layer 107 is formed be preheated in a preheating chamber of a sputtering apparatus, so that impurities such as hydrogen or moisture adsorbed onto the substrate 101 are eliminated and exhausted. As an exhaustion means provided in the preheating chamber, a cryopump is preferable. Note that this preheating treatment can be omitted. In addition, the preheating may be similarly performed on the substrate 101 over which the source and drain electrode layers 111a and 111b are formed before the deposition of the interlayer insulating layer 113.

Next, an oxide semiconductor film with a thickness of 2 to 200 nm, preferably 5 to 30 nm is formed over the gate insulating layer 107.

Note that before the oxide semiconductor film is deposited by sputtering, powdery substances (also referred to as particles or dust) which attach to a surface of the gate insulating layer 107 are preferably removed by reverse sputtering in which an argon gas is introduced and plasma is generated. The reverse sputtering is a method in which an RF power source is used for application of voltage to a substrate in an argon atmosphere and plasma is generated in the vicinity of the substrate so that a substrate surface is modified. Note that nitrogen, helium, oxygen, or the like may be used instead of the argon atmosphere.

As an oxide semiconductor used for the oxide semiconductor film, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Ga—O-based oxide semiconductor, or an In—Mg—O-based oxide semiconductor; a single-component metal oxide such as an In—O-based oxide semiconductor, a Sn—O-based oxide semiconductor, or a Zn—O-based oxide semiconductor; or the like can be used. Further, $SiO_2$ may be contained in the oxide semiconductor. Here, for example, an In—Ga—Zn—O-based oxide semiconductor means an oxide film containing indium (In), gallium (Ga), and zinc (Zn), and there is no particular limitation on the composition ratio. Further, the In—Ga—Zn—O-based oxide semiconductor may contain an element other than In, Ga, and Zn. In this embodiment, the oxide semiconductor film is deposited using an In—Ga—Zn—O-based oxide target by sputtering.

As a target used for the deposition of the oxide semiconductor film by sputtering, for example, an oxide target containing $In_2O_3$, $Ga_2O_3$, and ZnO at a composition ratio of 1:1:1 [molar ratio] is used, so that an In—Ga—Zn—O film is deposited. Without limitation on the material and the composition of the target, for example, an oxide target containing $In_2O_3$, $Ga_2O_3$, and ZnO at a composition ratio of 1:1:2 [molar ratio] may be used.

In the case where an In—Zn—O-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when a target used for the deposition of the In—Zn—O-based oxide semiconductor has a composition ratio of In:Zn:O=X:Y:Z in an atomic ratio, where $Z>1.5X+Y$.

The filling rate of the oxide target is 90 to 100%, preferably 95 to 99.9%. With the use of a metal oxide target with a high filling rate, a dense oxide semiconductor film can be deposited.

It is preferable that a high-purity gas from which impurities such as hydrogen, water, a hydroxyl group, or hydride are removed be used as a sputtering gas used for the deposition of the oxide semiconductor film.

The substrate is placed in a deposition chamber kept under reduced pressure, and the substrate temperature is 100 to 600° C., preferably 200 to 400° C. By deposition of the oxide semiconductor film while the substrate is heated, the concentration of impurities included in the deposited oxide semiconductor film can be lowered. In addition, damage by sputtering is reduced. Then, a sputtering gas from which hydrogen and moisture are removed is introduced while moisture remaining in the deposition chamber is removed, and the above target is used, so that the oxide semiconductor film is deposited over the substrate 101 with the use of the target. In order to remove moisture remaining in the deposition chamber, an adsorption vacuum pump such as a cryopump, an ion pump, or a titanium sublimation pump is preferably used. A turbo pump to which a cold trap is added may be used as an exhaustion means. For example, hydrogen, a compound containing hydrogen, such as water (preferably a compound containing carbon), and the like are exhausted from the deposition chamber with the use of a cryopump. Thus, the concentration of impurities contained in the oxide semiconductor film deposited in the deposition chamber can be lowered.

The atmosphere for the sputtering may be a rare gas (typically argon) atmosphere, an oxygen atmosphere, or a mixed atmosphere containing a rare gas and oxygen.

An example of the deposition condition is as follows: the distance between the substrate and the target is 100 mm, the pressure is 0.6 Pa, the DC power is 0.5 kW, and the atmosphere is an oxygen atmosphere (the proportion of the oxygen flow rate is 100%). Note that a pulsed DC power source is preferably used because powdery substances (also referred to as particles or dust) generated in the deposition can be reduced and the film thickness can be uniform.

Next, the oxide semiconductor film is processed into the island-shaped oxide semiconductor layer 109 through a second photolithography process. A resist mask used for forming the island-shaped oxide semiconductor layer may be formed by an inkjet method. When the resist mask is formed by an inkjet method, a photomask is not used; thus, manufacturing cost can be reduced.

In the case where a contact hole is formed in the gate insulating layer 107, the formation of the contact hole can be performed at the same time as processing of the oxide semiconductor film.

Note that as the etching of the oxide semiconductor film, dry etching, wet etching, or both dry etching and wet etching may be employed. As an etchant used for wet etching of the oxide semiconductor film, for example, a solution obtained by mixture of phosphoric acid, acetic acid, and nitric acid, or the like can be used. In addition, ITO07N (produced by KANTO CHEMICAL CO., INC.) may be used.

In this embodiment, the oxide semiconductor layer 109 is subjected to first heat treatment. The temperature of the first heat treatment is higher than or equal to 400° C. and lower than or equal to 750° C., preferably higher than or equal to 400° C. and lower than the strain point of the substrate. Here, after the substrate is put in an electric furnace that is a kind of heat treatment apparatus and the oxide semiconductor layer 109 is subjected to heat treatment at 450° C. for one hour in a nitrogen atmosphere, water or hydrogen is prevented from being mixed into the oxide semiconductor layer without exposure to the air; thus, the oxide semiconductor layer is obtained. Through the first heat treatment, the oxide semiconductor layer 109 can be dehydrated or dehydrogenated.

The heat treatment apparatus is not limited to an electric furnace, and a device for heating an object to be processed by thermal conduction or thermal radiation from a heater such as a resistance heater may be used. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas (e.g., argon), is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

Note that in the first heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

After the oxide semiconductor layer is heated in the first heat treatment, a high-purity oxygen gas, a high-purity $N_2O$ gas, or ultra-dry air (having a dew point of −40° C. or lower, preferably −60° C. or lower) may be introduced into the same furnace. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6N (99.9999%) or higher, more preferably 7N (99.99999%) or higher (that is, the impurity concentration in the oxygen gas or the $N_2O$ gas is 1 ppm or lower, preferably 0.1 ppm or lower). By the action of the oxygen gas or the $N_2O$ gas, oxygen which is a main component of the oxide semiconductor and which is reduced at the same time as the step of removing impurities by dehydration or dehydrogenation is supplied, so that the oxide semiconductor layer can be a highly purified electrically i-type (intrinsic) oxide semiconductor layer.

In addition, the first heat treatment for the oxide semiconductor layer can be performed before the oxide semiconductor film is processed into the island-shaped oxide semiconductor layer. In that case, the substrate is taken out of the heat treatment apparatus after the first heat treatment, and then a photolithography process is performed.

Note that other than the above timing, the first heat treatment may be performed at either of the following timings as long as it is performed after the oxide semiconductor layer is deposited: after a source electrode layer and a drain electrode layer are formed over the oxide semiconductor layer; and after an insulating layer is formed over the source electrode layer and the drain electrode layer.

Further, in the case where a contact hole is formed in the gate insulating layer 107, the formation of the contact hole may be performed before or after the first heat treatment is performed on the oxide semiconductor film.

In addition, as the oxide semiconductor layer, an oxide semiconductor layer having a crystal region with a large thickness, that is, a crystal region which is c-axis-aligned perpendicularly to a surface of the film may be formed by performing deposition twice and heat treatment twice, regardless of the material of a base component of the oxide semiconductor layer, such as an oxide, a nitride, or a metal. For example, after a first oxide semiconductor film with a thickness of 3 to 15 nm is deposited, first heat treatment is performed at 450 to 850° C., preferably 550 to 750° C. in the atmosphere of nitrogen, oxygen, a rare gas, or dry air, so that a first oxide semiconductor film which includes a crystalline region (including plate-like crystals) in a region including its surface is formed. Then, after a second oxide semiconductor film which has a larger thickness than the first oxide semiconductor film is formed, second heat treatment is performed at 450 to 850° C., preferably 600 to 700° C., so that crystal growth proceeds upward with the use of the first oxide semiconductor film as a seed of the crystal growth and the entire second oxide semiconductor film is crystallized. In such a manner, the oxide semiconductor layer having a thick crystal region may be formed.

Next, a conductive film serving as the source electrode layer and the drain electrode layer (including a wiring formed using the same layer as the source electrode layer and the drain electrode layer) is formed over the gate insulating layer 107 and the oxide semiconductor layer 109. The conductive film may be formed by sputtering or vacuum evaporation. As the material of the conductive film, an element selected from Al, Cr, Cu, Ta, Ti, Mo, or W; an alloy containing any of these elements as a component; an alloy film containing any of these elements in combination; or the like can be used. One or more materials selected from manganese, magnesium, zirconium, or beryllium may be used. Further, the conductive film can have a single-layer structure or a layered structure of two or more layers. For example, the conductive film can have a single-layer structure of an aluminum film containing silicon; a two-layer structure in which a titanium film is stacked over an aluminum film; a three-layer structure in which a titanium film, an aluminum film, and a titanium film are stacked in that order; or the like. Alternatively, the conductive film may be formed using a stack film, an alloy film, or a nitride film which contains aluminum and one or more of elements selected from titanium, tantalum, tungsten, molybdenum, chromium, neodymium, or scandium.

Then, a third photolithography process is performed. By etching of the conductive film, the source and drain electrode layers 111a and 111b are formed.

Note that it is preferable that etching conditions be optimized so that the oxide semiconductor layer 109 is not etched and divided when the conductive film is etched. However, it is difficult to obtain etching conditions in which only the conductive film is etched and the oxide semiconductor layer 109 is not etched at all. In some cases, only part of the oxide semiconductor layer 109 is etched to be an oxide semiconductor layer having a groove (a depression) when the conductive film is etched.

Next, water or the like adsorbed onto an exposed surface of the oxide semiconductor layer 109 may be removed by plasma treatment using a gas such as $N_2O$, $N_2$, or Ar. In the case where the plasma treatment is performed, the interlayer insulating layer 113 serving as a protective insulating film that is in contact with part of the oxide semiconductor layer is formed without exposure to the air.

The interlayer insulating layer 113 can be formed to a thickness of at least 1 nm or more by a method by which impurities such as water and hydrogen are not mixed into the interlayer insulating layer 113, such as sputtering, as appropriate. When hydrogen is contained in the interlayer insulating layer 113, entry of hydrogen to the oxide semiconductor layer 109 or extraction of oxygen contained in the oxide semiconductor layer 109 by hydrogen is caused; thus, a back-channel of the oxide semiconductor layer 109 might have low resistance (n-type conductivity) and a parasitic channel might be formed. It is therefore important to employ a deposition method in which hydrogen is not used in order to form the interlayer insulating layer 113 containing hydrogen as little as possible.

Like the interlayer insulating layer 113, an insulating layer which is formed in contact with the oxide semiconductor layer is formed using an inorganic insulating film which does not include impurities such as moisture, a hydrogen ion, and a hydroxide ion and blocks entry of these impurities from the outside. Typically, the insulating layer is formed using a silicon oxide film, a silicon oxynitride film, an aluminum oxide film, an aluminum oxynitride film, or the like. The substrate temperature at the time of deposition is in the range of room temperature to 300° C. For example, the silicon oxide film can be deposited by sputtering in a rare gas (typically argon) atmosphere, an oxygen atmosphere, or a mixed atmosphere containing a rare gas and oxygen. A silicon oxide target or a silicon target can be used as a target.

In order to remove moisture remaining in the deposition chamber of the interlayer insulating layer 113 in a manner similar to that of the deposition of the oxide semiconductor film, an adsorption vacuum pump (e.g., a cryopump) is preferably used. When the interlayer insulating layer 113 is deposited in the deposition chamber which is exhausted using a cryopump, the impurity concentration in the insulating layer 113 can be lowered. In addition, as an exhaustion means for removing moisture remaining in the deposition chamber used for depositing the interlayer insulating layer 113, a turbo pump to which a cold trap is added may be used.

It is preferable that a high-purity gas from which impurities such as hydrogen, water, a hydroxyl group, or hydride are removed be used as a sputtering gas used for the deposition of the interlayer insulating layer 113.

Next, second heat treatment (preferably at 200 to 400° C., for example, 250 to 350° C.) is performed in an inert gas atmosphere or an oxygen gas atmosphere. For example, the second heat treatment is performed at 250° C. for one hour in a nitrogen atmosphere. Through the second heat treatment, part (a channel formation region) of the oxide semiconductor layer is heated while being in contact with the interlayer insulating layer 113.

As described above, the second heat treatment is performed on the oxide semiconductor film so that impurities such as hydrogen, moisture, a hydroxyl group, or hydride (also referred to as a hydrogen compound) are intentionally removed from the oxide semiconductor layer, and then oxygen which is one of main components of the oxide semiconductor and is reduced at the same time as the step of removing impurities can be supplied. The oxide semiconductor layer is therefore a highly purified electrically i-type (intrinsic) oxide semiconductor layer.

When a silicon oxide layer having a lot of defects is used as the interlayer insulating layer 113, impurities such as hydrogen, moisture, a hydroxyl group, or hydride contained in the oxide semiconductor layer are diffused in the silicon oxide layer by heat treatment performed after the formation of the silicon oxide layer so that the impurities contained in the oxide semiconductor layer can be further reduced.

A protective insulating layer may be additionally formed over the interlayer insulating layer 113. For example, a silicon nitride film is formed by RF sputtering. Since the RF sputtering achieves high mass productivity, it is preferably used as the deposition method of the protective insulating layer. The protective insulating layer is formed using an inorganic insulating film which does not contain an impurity such as moisture and blocks entry of the impurity from the outside. For example, a silicon nitride film, an aluminum nitride film, or the like is used.

After the formation of the protective insulating layer, heat treatment may be further performed at 100 to 200° C. for 1 to 30 hours in the air. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature.

Next, a fourth photolithography process is performed. An opening is provided by etching of the interlayer insulating layer 113. This opening serves as the contact portion 123 where the source or drain electrode layer 111b and the first electrode layer 121 are connected to each other (see FIG. 6A).

Then, the color filter layer 115 is formed over the interlayer insulating layer 113. As the color filter layer, a green color filter layer, a blue color filter layer, a red color filter layer, or the like can be used. In this embodiment, a green color filter layer, a blue color filter, and a red color filter layer are sequentially formed. Each color filter layer is formed by a printing method, an inkjet method, etching using a photolithography technique, or the like. By provision of the color filter layer on a side of the substrate where a pixel electrode (the first electrode layer 121) is formed, alignment of the color filter layer and a light-emitting region of a light-emitting element can be performed independent of the alignment accuracy of a sealing substrate. The adjacent color filter layers may overlap with each other in a portion other than a region where the first electrode layer 121, the EL layer 129, and the second electrode layer 131 directly overlap with each other.

The color filter layer 115 includes the opening 125 including the contact portion 123 where the source or drain electrode layer 111b and the first electrode layer 121 to be formed later are connected to each other (see FIG. 6B). The light-emitting device in one embodiment of the present invention that is illustrated in FIG. 3A and FIG. 4A includes the source or drain electrode layer 111b for blocking visible light and the gate electrode layer 105 for blocking visible light in a portion which overlaps with the opening 125 in the color filter layer 115 and is between the EL layer and the substrate.

Next, the overcoat layer 117 which covers the color filter layer 115 is formed. A resin for transmitting visible light is used for the overcoat layer 117. In this embodiment, the overcoat layer 117 is formed through a photolithography process.

A resin such as an acrylic resin that can be used for the overcoat layer 117 contains much moisture. In order to protect the EL layer against moisture, an insulating film for covering the overcoat layer 117 may be formed. For example, a silicon nitride film, an aluminum nitride film, a silicon nitride oxide film, an aluminum oxynitride film, or the like can be used as the insulating film. In the case where a protective insulating layer is formed over the interlayer insulating layer 113 in the previous step, the insulating film is preferably formed using the same composition as the protective insulating layer because a fourth photolithography process can be omitted and the opening 125 can be provided by etching of the interlayer insulating layer 113, the protective insulating layer, and the insulating layer in one step.

Then, a conductive film for transmitting visible light is deposited so that the first electrode layer 121 is formed. The first electrode layer 121 is formed using indium oxide ($In_2O_3$), an alloy of indium oxide and tin oxide (ITO), or the like by sputtering, vacuum evaporation, or the like. Alternatively, an Al—Zn—O-based non-single-crystal film containing nitrogen (i.e., an Al—Zn—O—N-based non-single-crystal film), a Zn—O—N-based non-single-crystal film, or a Sn—Zn—O—N-based non-single-crystal film may be used as a different material of the first electrode layer 121. Note that the composition ratio (at. %) of zinc in the Al—Zn—O—N-based non-single-crystal film is 47 at. % or lower and is higher than that of aluminum in the non-single-crystal film; the composition ratio (at. %) of aluminum in the non-single-crystal film is higher than that of nitrogen in the non-single-crystal film. Such a material is etched with a hydrochloric acid-based solution. However, since a residue is easily generated particularly in etching of ITO, an alloy of indium oxide and zinc oxide ($In_2O_3$—ZnO) may be used in order to improve etching processability.

Note that the unit of the composition in the first electrode layer 121 is atomic percent (at. %), and the composition ratio is evaluated by analysis using an electron probe X-ray microanalyzer (EPMA).

Then, the partition 127 is formed so as to cover the opening 125 in the color filter layer 115. The partition 127 is formed using a film of an organic resin such as polyimide, acrylic, polyamide, or epoxy, an inorganic insulating film, or a siloxane-based resin.

Note that a siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

Phosphosilicate glass (PSG), borophosphosilicate glass (BPSG), or the like can be used for the partition 127. Note that the partition 127 may be formed using a stack of a plurality of insulating films formed using any of these materials.

There is no particular limitation on the method for forming the partition 127. The partition 127 can be formed, depending on the material, by a method such as sputtering, SOG, spin coating, dipping, spray coating, or a droplet discharge method (e.g., an inkjet method, screen printing, or offset printing), or with a tool such as a doctor knife, a roll coater, a curtain coater, or a knife coater. Further, other insulating layers used in the light-emitting device may be formed using the materials and methods which are shown as examples of the materials and methods of the partition 127.

Note that in the case where a region which does not block visible light exists in part in a portion which overlaps with the opening 225 in the color filter layer 215 and is between the EL layer 229 and the substrate 201, as in the light-emitting device in one embodiment of the present invention that is illustrated in FIG. 3B and FIG. 4B, the partition 227 is formed using a material for blocking visible light. As a material for blocking visible light, for example, a material in which a light absorption substance is dispersed in a resin which can be used for the partition 127 can be used.

Figure 6C:
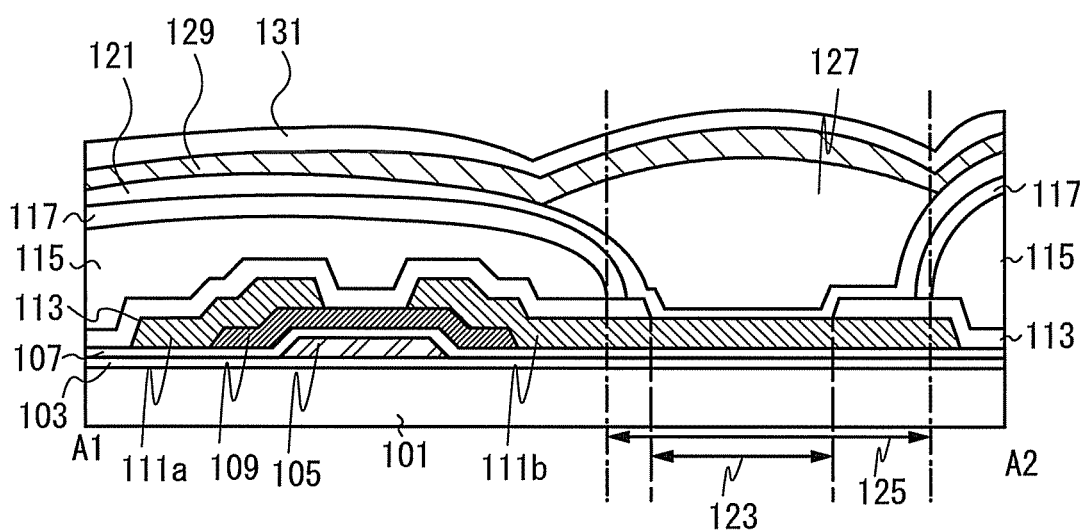

Next, the EL layer 129 is formed over the first electrode layer 121 and the partition 127 and the second electrode layer 131 is formed over the EL layer 129, so that the light-emitting element is formed (see FIG. 6C). An example of the structure of the EL layer 129 will be described in detail in Embodiment 3. The EL layer 129 includes a highly-conducting layer and a layer containing a light-emitting organic compound. Current therefore flows through the partition 127 via the highly-conducting layer. Consequently, the EL layer also emits light over the partition 127. That is, the EL layer emits light in a region of the color filter layer 115 that overlaps with the opening 125. When light which does not transmit through the color filter layer 115 leaks through the opening 125, the color range of the entire light-emitting device decreases, which is problematic. In the light-emitting device in this embodiment that is illustrated in FIG. 6C, however, such a problem can be prevented because in the opening 125, the source electrode layer (or the drain electrode layer) 111b is provided between the EL layer 129 and the substrate 101.

A variety of materials can be used for the second electrode layer 131. The second electrode layer 131 is preferably formed using a material with a low work function, for example, an alkali metal such as Li or Cs; an alkaline earth metal such as Mg, Ca, or Sr; an alloy containing any of these metals (e.g., Mg—Ag or Al—Li); or a rare earth metal such as Yb or Er.

In the light-emitting device in this embodiment that is manufactured by the above manufacturing method, provision of the highly-conducting layer as the EL layer makes the drive voltage of the light-emitting element lower. A low-power light-emitting device can be realized using the light-emitting element with low drive voltage.

In addition, since the color filter layer is provided between the first electrode layer of the light-emitting element and the substrate, the color filter layer can be formed successively after a highly-conducting wiring is formed over the substrate. Thus, manufacturing steps can be facilitated and cost can be reduced.

In the light-emitting device in this embodiment, by provision of a partition for blocking visible light over the first electrode layer overlapping with the opening in the color filter layer or provision of the layer for blocking visible light that overlaps with the opening in the color filter layer between the EL layer and the substrate, light which does not transmit through the color filter layer can be prevented from leaking through the opening in the color filter layer, so that the decrease in the color range of the entire light-emitting device can be prevented.

Note that although an example of an active-matrix light-emitting device is described in this embodiment, this embodiment can also be applied to a passive-matrix light-emitting device.

Note that there is no particular limitation on the structure of a transistor in the case where an active-matrix light-emitting device is manufactured. In addition, either an n-channel transistor or a p-channel transistor may be used. Further, either a staggered transistor or an inverted staggered transistor may be used.

This embodiment can be combined with any of the other embodiments as appropriate.

Embodiment 3

In this embodiment, an example of an EL layer used in a light-emitting device in one embodiment of the present invention is described with reference to FIG. 7. An EL layer described in this embodiment can be used as the EL layer 129 (see FIG. 3A and FIG. 4A) and the EL layer 229 (see FIG. 3B and FIG. 4B) in Embodiment 1.

Figure 7:
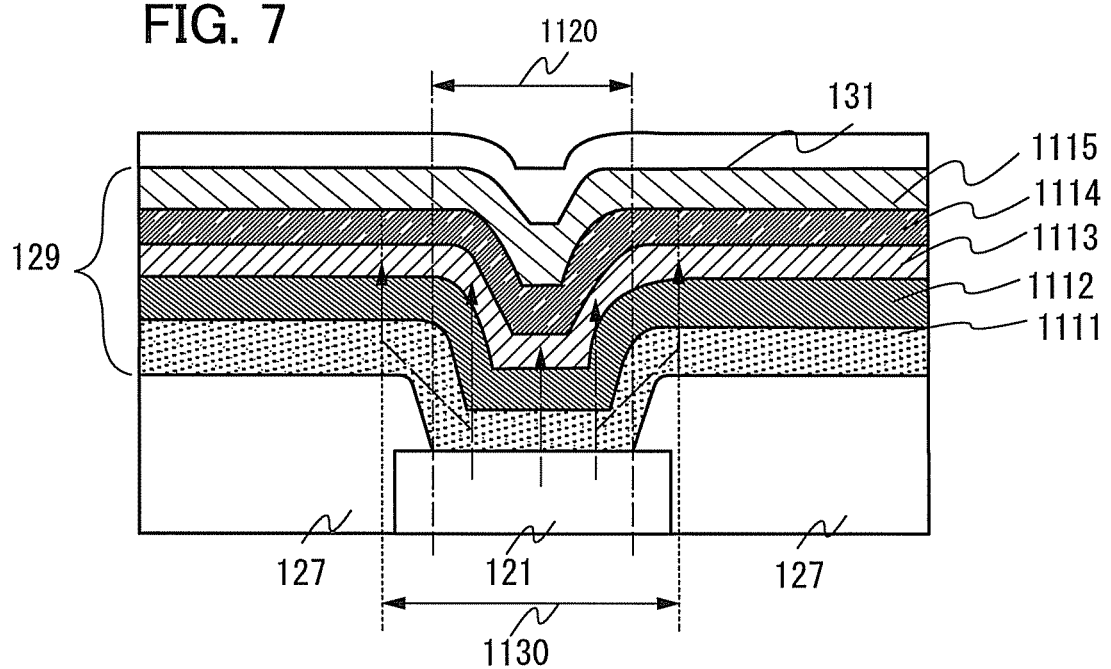
FIG. 7 illustrates a light-emitting layer of a light-emitting device in an embodiment.

The EL layer 129 in this embodiment that is illustrated in FIG. 7 is provided between the pair of electrodes (the first electrode layer 121 and the second electrode layer 131). A region 1120 where the first electrode layer 121 is in direct contact with the EL layer 129 and overlaps with the second electrode layer 131 is a desired light-emitting region. The EL layer 129 includes a hole injection layer 1111, a hole transport layer 1112, a light-emitting layer 1113, an electron transport layer 1114, and an electron injection layer 1115 as functional layers. Note that the first electrode layer 121 and the second electrode layer 131 may be formed using the materials described in Embodiment 2.

The EL layer 129 includes a highly-conducting layer between the first electrode layer 121 and the light-emitting layer 1113. Examples of the highly-conducting layer include a layer containing a highly-conducting substance and a layer containing a donor substance and an acceptor substance. Specifically, a layer in which an alkali metal, an alkaline earth metal, a rare earth metal, an alkali metal compound, an alkaline earth metal compound, or a rare earth metal compound is added to an organic compound, or a layer containing a conductive polymer such as poly(3,4-ethylenedioxythiophene)/poly(styrenesulfonic acid) (PEDOT/PSS) can be used.

For example, since the hole injection layer 1111 formed using PEDOT/PSS has high conductivity, current flows from the first electrode layer 121 to the second electrode layer 131 as indicated by arrows in FIG. 7. That is, current flows through the partitions 127 provided outside the desired light-emitting region 1120. In this manner, current flows through the insulating partitions 127 via the highly-conducting layer (the hole injection layer 1111 in FIG. 7). Consequently, the EL layer 129 also emits light over the partitions provided in the opening in the color filter layer (see a light-emitting region 1130 in FIG. 7). If light which does not transmit through the color filter layer leaks through the opening in the color filter layer, the color range of the entire light-emitting device decreases, which is problematic. However, such a problem can be solved because the light-emitting device in one embodiment of the present invention (e.g., the light-emitting device described in Embodiment 1) includes the insulating partition formed using a material for blocking visible light or the layer for blocking visible light between the EL layer and the substrate in the opening in the color filter layer.

A known substance can be used for the EL layer 129, and either a low molecular compound or a high molecular compound can be used. Note that the substance used for the EL layer 129 is not limited to a substance containing only an organic compound, and it may partly contain an inorganic compound.

As illustrated in FIG. 7, the EL layer 129 includes not only the light-emitting layer 1113 but also the following layers stacked in appropriate combination: the hole injection layer 1111, the hole transport layer 1112, the electron transport layer 1114, the electron injection layer 1115, and the like.

The hole injection layer 1111 contains a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. Alternatively, a phthalocyanine-based compound such as phthalocyanine (abbreviation: $H_2Pc$) or copper(II) phthalocyanine (abbreviation: CuPc) can be used.

Alternatively, the following aromatic amine compounds that are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Alternatively, a high molecular compound (e.g., an oligomer, a dendrimer, or a polymer) can be used. For example, the following high molecular compounds can be used: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), and the like. Alternatively, a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can be used.

For the hole injection layer 1111, a composite material in which an organic compound and an electron acceptor are mixed may be used. Such a composite material is excellent in a hole injection property and a hole transport property because holes are generated in the organic compound by the electron acceptor. In that case, the organic compound is preferably a material that is excellent in transport of the generated holes (a substance having a high hole transport property).

As the organic compound used for the composite material, a variety of compounds such as an aromatic amine compound, a carbazole derivative, aromatic hydrocarbon, and a high molecular compound (e.g., an oligomer, a dendrimer, or a polymer) can be used. Note that the organic compound used for the composite material is preferably an organic compound having a high hole transport property. Specifically, a substance having a hole mobility of $10^{-6}$ cm$^2$/Vs or higher is preferably used. Note that a substance other than the above may be used as long as it has a higher hole transport property than an electron transport property. Organic compounds that can be used for the composite material are specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Alternatively, the following aromatic hydrocarbon compounds can be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Alternatively, the following aromatic hydrocarbon compounds can be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Further, as the electron acceptor, an organic compound such as 7,7,8,8-tetracyano-2,3,5,6-tetrafluoroquinodimethane (abbreviation: F$_4$-TCNQ) or chloranil, or a transition metal oxide can be used. Alternatively, an oxide of a metal that belongs to Groups 4 to 8 in the periodic table can be used. Specifically, vanadium oxide, niobium oxide, tantalum oxide, chromium oxide, molybdenum oxide, tungsten oxide, manganese oxide, and rhenium oxide are preferable because they have high electron accepting properties. In particular, molybdenum oxide is preferable because it can be easily treated due to its stability in the air and low hygroscopic property.

Note that the hole injection layer 1111 may be formed using a composite material of the high molecular compound such as PVK, PVTPA, PTPDMA, or Poly-TPD, and the electron acceptor.

The hole transport layer 1112 contains a substance having a high hole transport property. As the substance having a high hole-transport property, the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), 4,4'-bis[N-(spiro-9,9'-bifluoren-2-yl)-N-phenylamino]biphenyl (abbreviation: BSPB), and the like. Most of the substances described here each have a hole mobility of $10^{-6}$ cm$^2$/V·s or higher. Note that a substance other than the above may be used as long as it has a higher hole transport property than an electron transport property. The layer containing a substance having a high hole transport property is not limited to a single layer, and may be a stack of two or more layers containing any of the above substances.

For the hole transport layer 1112, a carbazole derivative such as CBP, CzPA, or PCzPA or an anthracene derivative such as t-BuDNA, DNA, or DPAnth may be used.

For the hole transport layer 1112, a high molecular compound such as PVK, PVTPA, PTPDMA, or Poly-TPD can be used.

The light-emitting layer 1113 contains a light-emitting substance. As the light-emitting substance, for example, a fluorescent compound which emits fluorescence or a phosphorescent compound which emits phosphorescence can be used. Examples of phosphorescent compounds that can be used for the light-emitting layer 1113 are described. As a material for blue light emission, the following can be used: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (PCBAPA), and the like. As a material for green light emission, the following can be used: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',-triphenyl-1,4-phenylenediamine abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. As a material for yellow light emission, the following can be used: rubrene, 5,12-bis(1,1'-biphenyl-4-yl)-6,11-diphenyltetracene (abbreviation: BPT), and the like. As a material for red light emission, the following can be used: N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

Further, examples of phosphorescent compounds that can be used for the light-emitting layer 1113 are described. As a material for green light emission, the following can be used: tris(2-phenylpyridinato-N,C$^{2'}$)iridium(III) (abbreviation: [Ir(ppy)$_3$]), bis(2-phenylpyridinato-N,C$^{2'}$)iridium(III)acetylacetonate (abbreviation: [Ir(ppy)$_2$(acac)]), bis(1,2-diphenyl-1H-benzimidazolato)iridium(III)acetylacetonate (abbreviation: [Ir(pbi)$_2$(acac)]), bis(benzo[h]quinolinato)iridium(III)acetylacetonate (abbreviation: [Ir(bzq)$_2$(acac)]), tris(benzo[h]quinolinato)iridium(III) (abbreviation: [Ir(bzq)$_3$]), and the like. As a material for yellow light emission, the following can be used: bis(2,4-diphenyl-1,3-oxazolato-N,C$^{2'}$)iridium(III)acetylacetonate (abbreviation: [Ir(dpo)$_2$(acac)]), bis[2-(4'-(perfluorophenyl)phenyl) pyridinato]iridium(III)acetylacetonate (abbreviation: [Ir(p-PF-ph)$_2$(acac)]), bis(2-phenylbenzothiazolato-N,C$^{2'}$)iridium(III)acetylacetonate (abbreviation: [Ir(bt)$_2$(acac)]), (acetylacetonato)bis[2,3-bis(4-fluorophenyl)-5-methylpyrazinato]iridium(III) (abbreviation: [Ir(Fdppr-Me)$_2$(acac)]), (acetylacetonato)bis{2-(4-methoxyphenyl)-3,5-dimethylpyrazinato}iridium(III) (abbreviation: [Ir(dmmoppr)$_2$(acac)]), and the like. As a material for orange light emission, the following can be used: tris(2-phenylquinolinato-N,C$^{2'}$)iridium(III) (abbreviation: [Ir(pq)$_3$]), bis(2-phenylquinolinato-N,C$^{2'}$)iridium(III)acetylacetonate (abbreviation: [Ir(pq)$_2$(acac)]), (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), and the like. As a material for red light emission, the following organometallic complexes can be used: bis[2-(2'-benzo[4,5-α]thienyl)pyridinato-N,C$^{3'}$)iridium(III)acetylacetonate (abbreviation: [Ir(btp)$_2$(acac)]), bis(1-phenylisoquinolinato-N,C$^{2'}$)iridium(III)acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), (dipivaloylmethanato)bis(2,3,5-triphenylpyrazinato)iridium(III) (abbreviation: [Ir(tppr)$_2$(dpm)]), and (2,3,7,8,12,13,17,18-octaethyl-21H,23H-porphyrin)platinum(II) (abbreviation: PtOEP). In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare earth metal ion; thus, such a rare earth metal complex can be used as a phosphorescent compound.

As the light-emitting substance, a high molecular compound can be used. Specifically, as a material for blue light emission, the following can be used: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. As a material for green light emission, the following can be used: poly(p-phenylenevinylene) (abbreviation: PPV), poly[(9,9-dihexylfluorene-2,7-diyl)-alt-co-(benzo[2,1,3]thiadiazol-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], and the like. As a material for orange to red light emission, the following can be used: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

The light-emitting layer 1113 may contain an organic compound in which the light-emitting substance is dispersed. As the organic compound in which the light-emitting substance is dispersed, in the case where the light-emitting substance is a fluorescent compound, a substance having higher singlet excitation energy (the energy difference between a ground state and a singlet excited state) than the fluorescent compound is preferably used. In the case where the light-emitting substance is a phosphorescent compound, a substance having higher triplet excitation energy (the energy difference between a ground state and a triplet excited state) than the phosphorescent compound is preferably used.

As the organic compound in which the light-emitting substance is dispersed, the following can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be used. Specifically, the following can be used: 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(N-carbazolyl)phenyl]-10-phenylanthracene (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like.

Note that the light-emitting layer 1113 may be formed using two or more kinds of the light-emitting substances or may be formed using two or more kinds of the organic compounds in which the light-emitting substances are dispersed.

The electron transport layer 1114 contains a substance with a high electron transport property. As the substance with a high electron transport property, for example, a metal complex having a quinoline skeleton or a benzoquinoline skeleton, such as Alq, Almq$_3$, BeBq$_2$, or BAlq, can be used. Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. Most of the substances described here each have an electron mobility of $10^{-6}$ cm$^2$/V·s or higher. The electron transport layer is not limited to a single layer, and may be a stack of two or more layers containing any of the above substances.

The electron injection layer 1115 contains a substance having a high electron injection property. For the electron injection layer 1115, an alkali metal, an alkaline earth metal, or a compound thereof, such as lithium, cesium, calcium, lithium fluoride, cesium fluoride, calcium fluoride, or lithium oxide, can be used. Alternatively, a rare earth metal compound such as erbium fluoride can be used. Alternatively, any of the above substances used for the electron transport layer 1114 can be used.

Alternatively, a composite material in which an organic compound and an electron donor are mixed may be used for the electron injection layer 1115. Such a composite material is excellent in an electron injection property and an electron transport property because electrons are generated in the organic compound by the electron donor. In that case, the organic compound is preferably a material excellent in transport of the generated electrons. Specifically, any of the above substances used for the electron transport layer 1114 (e.g., a metal complex or a heteroaromatic compound) can be used, for example. As the electron donor, a substance with an electron donating property to the organic compound may be used. Specifically, it is preferable to use an alkali metal, an alkaline earth metal, or a rare earth metal, such as lithium, cesium, magnesium, calcium, erbium, or ytterbium. Further, it is preferable to use an alkali metal oxide or an alkaline earth metal oxide, such as lithium oxide, calcium oxide, or barium oxide. Alternatively, a Lewis base such as magnesium oxide can be used. Alternatively, an organic compound such as tetrathiafulvalene (abbreviation: TTF) can be used.

Note that each of the hole injection layer 1111, the hole transport layer 1112, the light-emitting layer 1113, the electron transport layer 1114, and the electron injection layer 1115 can be formed by a method such as evaporation (including vacuum evaporation), an inkjet method, or a coating method.

Further, the structure of a layer provided between the first electrode layer 121 and the second electrode layer 131 is not limited to the above structure. In other words, the layered structure of the layer is not particularly limited to a certain structure, and a layer formed using a substance with a high electron transport property, a substance with a high hole transport property, a substance with a high electron injection property, a substance with a high hole injection property, a bipolar substance (a substance with a high electron transport property and a high hole transport property), a hole blocking material, or the like may be freely combined with a light-emitting layer.

A specific method for forming a light-emitting element is described below.

The light-emitting element in this embodiment has a structure in which an EL layer is held between a pair of electrodes. The EL layer includes at least a highly-conducting layer and a light-emitting layer. The EL layer may be formed by a wet process such as a droplet discharge method (an inkjet method), spin coating, or a printing method, or by a dry process such as vacuum evaporation, CVD, or sputtering. The use of a wet process enables the formation at atmospheric pressure using a simple device and process; thus, effects of simplifying the process and improving productivity cad be obtained. In contrast, in a dry process, dissolution of a material is not needed; thus, a material that has low solubility in a solution can be used, which leads to expansion of the range of material choices.

All the thin films included in the light-emitting element may be formed by a wet process. In that case, the light-emitting element can be formed with only facilities needed for a wet process. Alternatively, the stacked layers up to and including the light-emitting layer may be formed by a wet process, and the functional layer, the second electrode layer, and the like which are stacked over the light-emitting layer may be formed by a dry process. Alternatively, the functional layer and the first electrode layer may be formed by a dry process before the formation of the light-emitting layer, and the light-emitting layer, the functional layer stacked thereover, and the second electrode layer may be formed by a wet process. Needless to say, this embodiment is not limited to this. The light-emitting element can be formed by appropriate selection from a wet process and a dry process depending on a material to be used, necessary film thickness, and an interface state.

As described above, provision of the highly-conducting layer as the EL layer in this embodiment makes the drive voltage of the light-emitting element lower. A low-power light-emitting device can be realized using the light-emitting element with low drive voltage.

This embodiment can be combined with any of the other embodiments as appropriate.

Embodiment 4

In this embodiment, an example of an EL layer used in a light-emitting device in one embodiment of the present invention is described with reference to FIGS. 8A and 8B. An EL layer described in this embodiment can be used as the EL layer 129 (see FIG. 3A and FIG. 4A) and the EL layer 229 (see FIG. 3B and FIG. 4B) in Embodiment 1. The EL layer described in this embodiment has a structure in which a plurality of light-emitting units are stacked.

Figure 8A:
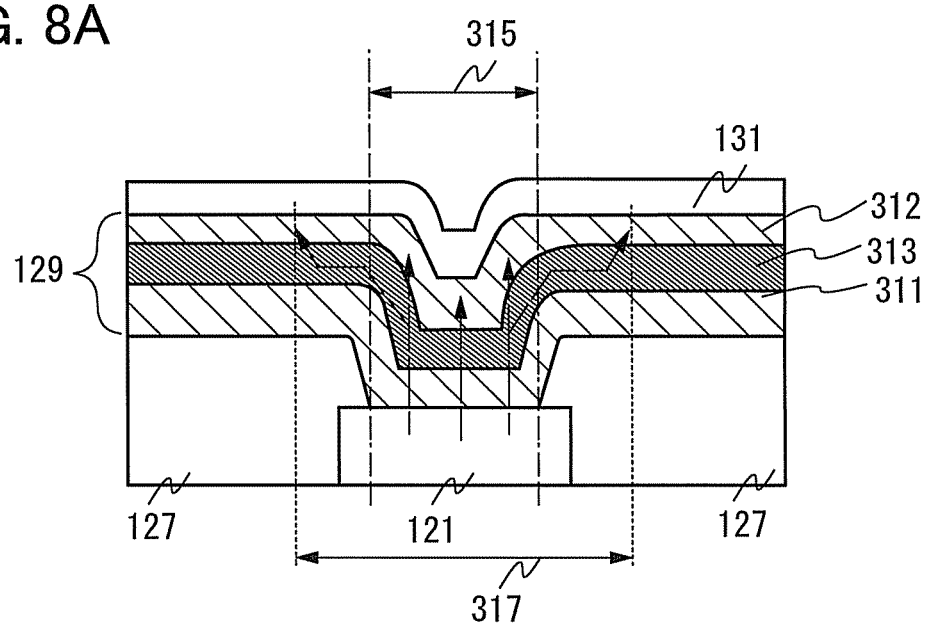
FIGS. 8A and 8B illustrate a light-emitting layer of a light-emitting device in an embodiment.

In FIG. 8A, the EL layer 129 provided between the first electrode layer 121 and the second electrode layer 131 has a structure in which a first light-emitting unit 311 and a second light-emitting unit 312 are stacked. In this embodiment, the first electrode layer 121 functions as an anode, and the second electrode layer 131 functions as a cathode. Note that the first electrode layer 121 and the second electrode layer 131 can be similar to those in Embodiments 2 and 3. Further, the first light-emitting unit 311 and the second light-emitting unit 312 may have the same or different structures. The first light-emitting unit 311 and the second light-emitting unit 312 may be similar to those in Embodiment 3, or either of the units may be different from that in Embodiment 3.

Further, a charge generation layer 313 is provided between the first light-emitting unit 311 and the second light-emitting unit 312. The charge generation layer 313 injects electrons into one light-emitting unit and injects holes into the other light-emitting unit when voltage is applied to the first electrode layer 121 and the second electrode layer 131. In this embodiment, when voltage is applied to the first electrode layer 121 so that the potential thereof is higher than that of the second electrode layer 131, the charge generation layer 313 injects electrons into the first light-emitting unit 311 and injects holes into the second light-emitting unit 312.

Note that the charge generation layer 313 preferably transmits visible light in terms of light extraction efficiency. Further, the charge generation layer 313 functions even when it has lower conductivity than the first electrode layer 121 or the second electrode layer 131.

The charge generation layer 313 may contain an organic compound with a high hole transport property and an electron acceptor. Alternatively, the charge generation layer 313 may contain an organic compound with a high electron transport property and an electron donor. Alternatively, both of these structures may be stacked.

In the case where the charge generation layer 313 contains an organic compound with a high hole transport property and an electron acceptor, as the organic compound with a high hole transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. Most of the substances described here each have a hole mobility of $10^{-6}$ cm$^2$/V·s or higher. Note that an organic compound other than the above may be used as long as it has a higher hole transport property than an electron transport property.

As the electron acceptor, 7,7,8,8-tetracyano-2,3,5,6-tetrafluoroquinodimethane (abbreviation: F$_4$-TCNQ), chloranil, or the like can be used. Alternatively, a transitional metal oxide can be used. Alternatively, an oxide of a metal that belongs to Groups 4 to 8 in the periodic table can be used. Specifically, vanadium oxide, niobium oxide, tantalum oxide, chromium oxide, molybdenum oxide, tungsten oxide, manganese oxide, and rhenium oxide are preferable because they have high electron accepting properties. In particular, molybdenum oxide is preferable because it can be easily treated due to its stability in the air and low hygroscopic property.

On the other hand, in the case where the charge generation layer 313 contains an organic compound with a high electron transport property and an electron donor, as the organic compound with a high electron transport property, for example, a metal complex having a quinoline skeleton or a benzoquinoline skeleton, such as Alq, Almq$_3$, BeBq$_2$, or BAlq, can be used. Alternatively, a metal complex having an oxazole-based ligand or a thiazole-based ligand, such as Zn(BOX)$_2$ or Zn(BTZ)$_2$ can be used. Other than the metal complexes, PBD, OXD-7, TAZ, BPhen, BCP, or the like can be used. Most of the substances described here each have an electron mobility of $10^{-6}$ cm$^2$/V·s or higher. Note that an organic compound other than the above may be used as long as it has a higher electron transport property than a hole transport property.

Further, as the electron donor, an alkali metal, an alkaline earth metal, a rare earth metal, a metal that belongs to Group 13 in the periodic table, or an oxide or carbonate thereof can be used. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

Note that by formation of the charge generation layer 313 with the use of any of the above materials, it is possible to suppress the increase in drive voltage caused when the EL layers are stacked.

In this embodiment, the charge generation layer 313 is formed by co-evaporation of BPhen and lithium. The ratio of lithium to BPhen is adjusted so as to be 1:0.02 (=BPhen:Li) (ratio by weight), and the thickness of the charge generation layer 313 is 10 nm. Since the charge generation layer 313 thus obtained has high conductivity, current flows from the first electrode layer 121 to the second electrode layer 131 as indicated by arrows in FIG. 8A. That is, current also flows through the outside of a desired light-emitting region 315. In this manner, current flows through the insulating partitions 127 via the highly-conducting layer (the charge generation layer 313 in FIG. 8A). Consequently, the second light-emitting unit 312 emits light over the partitions provided in the opening in the color filter layer (see a light-emitting region 317 in FIG. 8A). If light which does not transmit through the color filter layer leaks through the opening in the color filter layer, the color range of the entire light-emitting device decreases, which is problematic. However, such a problem can be solved because the light-emitting device in one embodiment of the present invention (e.g., the light-emitting device described in Embodiment 1) includes the insulating partition formed using a material for blocking visible light or the layer for blocking visible light between the EL layer and the substrate in the opening in the color filter layer.

Note that a co-evaporation method is an evaporation method by which evaporation is carried out from a plurality of evaporation sources at the same time in one treatment chamber.

Figure 8B:
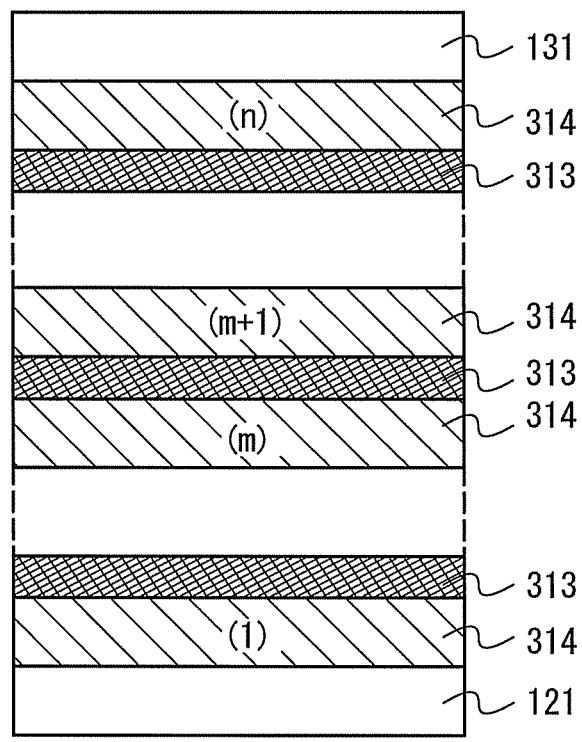

Although the light-emitting element having two light-emitting units is described in this embodiment, a light-emitting element having a stack of three or more light-emitting units 314 can be employed as illustrated in FIG. 8B. For example, in the case of a structure in which n (n is a natural number of 2 or more) layers are stacked, the charge generation layer 313 is provided between an m-th (m is a natural number of 1 or more and (n−1) or less) light-emitting unit and an (m+1)-th light-emitting unit. When a plurality of light-emitting units which are partitioned by a charge generation layer are arranged between a pair of electrodes, as in the light-emitting element in this embodiment, it is possible to realize a long-life element which emits light with high luminance while current density is kept low.

Note that this embodiment can be combined with any of the other embodiments as appropriate.

Embodiment 5

Figure 9A:
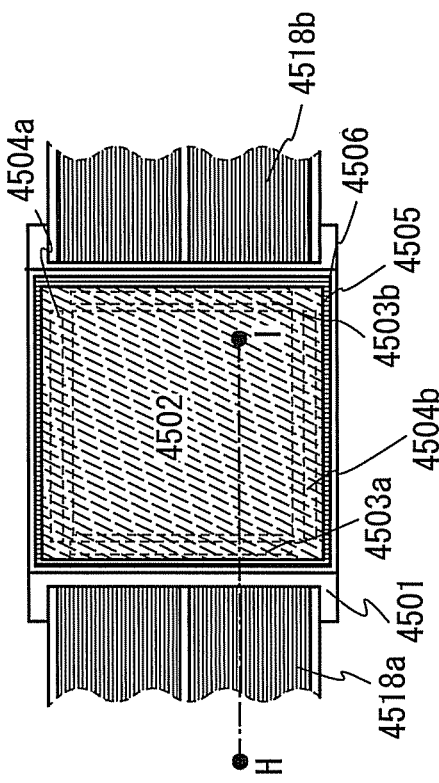
FIGS. 9A and 9B illustrate a light-emitting device in an embodiment.
Figure 9B:
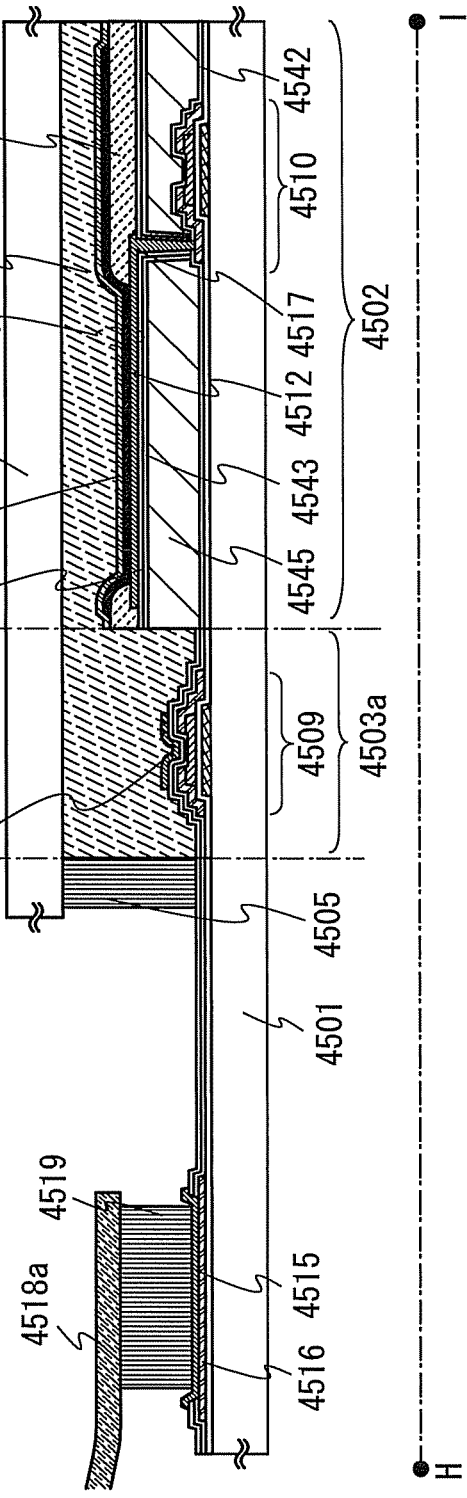

In this embodiment, the appearance and a cross section of a light-emitting display panel (also referred to as a light-emitting panel) are described with reference to FIGS. 9A and 9B. FIG. 9A is the plan view of a panel in which a transistor and a light-emitting element which are formed over a first substrate are sealed between the first substrate and a second substrate with a sealant. FIG. 9B is the cross-sectional view taken along line H-I in FIG. 9A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Thus, the pixel portion 4502, the signal line driver circuits 4503a and 4503b, and the scan line driver circuits 4504*a* and 4504*b* are sealed together with a filler 4507 by the first substrate 4501, the sealant 4505, and the second substrate 4506. It is preferable that the panel be packaged (sealed) with a protective film (e.g., an attachment film or an ultraviolet curable resin film) or a cover material that has high air-tightness and causes less degasification so that the panel is not exposed to the external air, in this manner.

Further, the pixel portion 4502, the signal line driver circuits 4503*a* and 4503*b*, and the scan line driver circuits 4504*a* and 4504*b* which are provided over the first substrate 4501 each include a plurality of transistors, and a transistor 4510 included in the pixel portion 4502 and a transistor 4509 included in the signal line driver circuit 4503*a* are illustrated in FIG. 9B.

For semiconductor layers in the transistors 4509 and 4510 in this embodiment, an oxide semiconductor which is made to be an intrinsic (i-type) or substantially intrinsic by removal of impurities is used. The drive transistor 100 or 200 described in Embodiment 1 can be used as the transistor 4509, and the switching transistor 130 or 230 described in Embodiment 1 can be used as the transistor 4510. In this embodiment, the transistors 4509 and 4510 are n-channel transistors.

A conductive layer 4540 is provided over an insulating layer 4544 so as to overlap with a channel formation region of the oxide semiconductor layer in the transistor 4509. The conductive layer 4540 is provided so as to overlap with the channel formation region of the oxide semiconductor layer, whereby the amount of change in the threshold voltage of the transistor 4509 before and after BT test can be reduced. Further, the potential of the conductive layer 4540 may be the same as or different from that of a gate electrode layer in the transistor 4509. The conductive layer 4540 can function also as a second gate electrode layer. Alternatively, the potential of the conductive layer 4540 may be GND or 0 V, or the conductive layer 4540 may be in a floating state.

The transistor 4510 is electrically connected to a first electrode layer 4517.

A color filter layer 4545 is formed over an oxide insulating layer 4542 so as to overlap with a light-emitting region of a light-emitting element 4511.

Further, in order to reduce the surface unevenness of the color filter layer 4545, the color filter layer 4545 is covered with an overcoat layer 4543 functioning as a planarization insulating film.

Further, the insulating layer 4544 is formed over the overcoat layer 4543. The insulating layer 4544 may be formed using a material and a method which are similar to those of the protective insulating film described in Embodiment 1.

A first electrode layer 4517 which is a pixel electrode of the light-emitting element 4511 is electrically connected to a source electrode layer or a drain electrode layer of the transistor 4510. Note that although the light-emitting element 4511 has a layered structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

A partition 4520 is formed using a material for blocking visible light. Any of the materials used for the partition 227 described in Embodiments 1 and 2 can be used as the material for blocking visible light. Note that in the case where a layer for blocking visible light is provided in a portion which overlaps with an opening in the color filter layer 4545 and is between an EL layer of the light-emitting element 4511 and the first substrate 4501, the partition does not necessarily block visible light.

The electroluminescent layer 4512 may be formed using either a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied from FPCs 4518*a* and 4518*b* to the signal line driver circuits 4503*a* and 4503*b*, the scan line driver circuits 4504*a* and 4504*b*, or the pixel portion 4502.

A connection terminal electrode 4515 is formed using the same conductive film as the first electrode layer 4517 of the light-emitting element 4511, and a terminal electrode 4516 is formed using the same conductive film as a source electrode layer and a drain electrode layer of the transistor 4509.

The connection terminal electrode 4515 is electrically connected to a terminal of the FPC 4518*a* through an anisotropic conductive film 4519.

The substrate located in the direction in which light is extracted from the light-emitting element 4511 needs to transmit visible light. In that case, a material for transmitting visible light, such as a glass plate, a plastic plate, a polyester film, or an acrylic film, is used.

Further, in addition to an inert gas such as nitrogen or argon, an ultraviolet curable resin or a thermosetting resin can be used as the filler 4507. PVC (poly(vinyl chloride)), an acrylic resin, polyimide, an epoxy resin, a silicone resin, PVB (poly(vinyl butyral)), or EVA (a copolymer of ethylene with vinyl acetate) can be used. For example, nitrogen may be used for the filler.

In addition, if needed, an optical film such as a polarizing plate, a circular polarizing plate (including an elliptical polarizing plate), a retardation plate (a quarter-wave plate or a half-wave plate), or a color filter may be provided as appropriate on a light-emitting surface of the light-emitting element. Further, the polarizing plate or the circular polarizing plate may be provided with an anti-reflection film. For example, anti-glare treatment can be performed by which reflected light can be diffused by projections and depressions on a surface so that glare can be reduced.

The signal line driver circuits 4503*a* and 4503*b* and the scan line driver circuits 4504*a* and 4504*b* may be provided by mounting driver circuits formed using a single crystal semiconductor film or a polycrystalline semiconductor film over a substrate separately prepared. Note that only the signal line driver circuits 4503*a* and 4503*b* or part thereof, or only the scan line driver circuits 4504*a* and 4504*b* or part thereof may be separately formed and mounted. This embodiment is not limited to the structure illustrated in FIGS. 9A and 9B.

Through the above steps, a light-emitting display device (display panel) can be manufactured.

Embodiment 6

In this embodiment, electronic devices each including the light-emitting device in one embodiment of the present invention that is described in the above embodiment are described. Examples of such electronic devices include cameras such as video cameras and digital cameras, goggle-type displays, navigation systems, audio reproducing devices (e.g., car audio components and audio components), computers, game machines, personal digital assistants (e.g., mobile computers, cellular phones, portable game machines, and e-book readers), image reproducing devices provided with recording media (specifically, devices which reproduce recording media such as digital versatile discs (DVDs) and have display devices for displaying images), and the like. FIGS. 10A to 10F illustrate specific examples of these electronic devices.

Figure 10A:
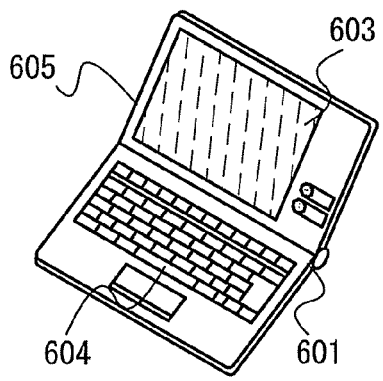
FIGS. 10A to 10F illustrate electronic devices in an embodiment.

FIG. 10A illustrates a laptop personal computer, which includes a housing 601, a housing 605, a display portion 603, a keyboard 604, and the like. In this computer, the light-emitting device in one embodiment of the present invention can be applied to the display portion 603. The light-emitting device in one embodiment of the present invention has low driving voltage; thus, by the application of the light-emitting device in one embodiment of the present invention, a computer with lower power consumption can be obtained.

Figure 10D:
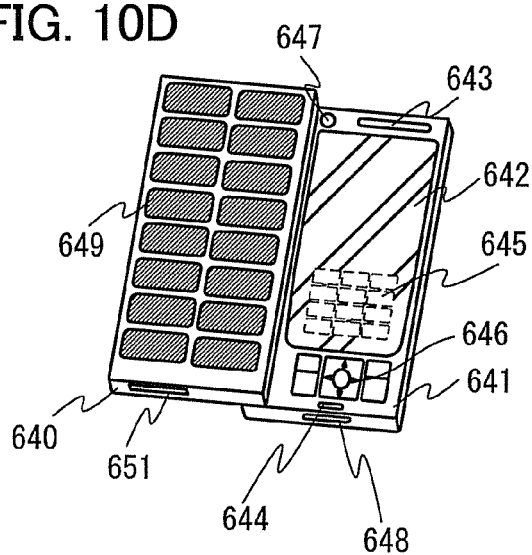
Figure 10B:
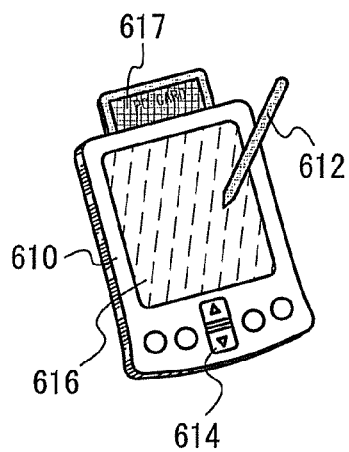

FIG. 10B illustrates a personal digital assistant (PDA), which includes a main body 610 provided with a display portion 616, an external interface 617, operation buttons 614, and the like. In addition, a stylus 612 for controlling the personal digital assistant is provided, for example. The light-emitting device in one embodiment of the present invention can be applied to the display portion 616. The light-emitting device in one embodiment of the present invention has low driving voltage; thus, by the application of the light-emitting device in one embodiment of the present invention, a personal digital assistant with lower power consumption can be obtained.

Figure 10E:
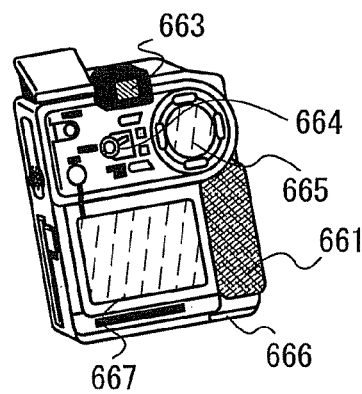
Figure 10C:
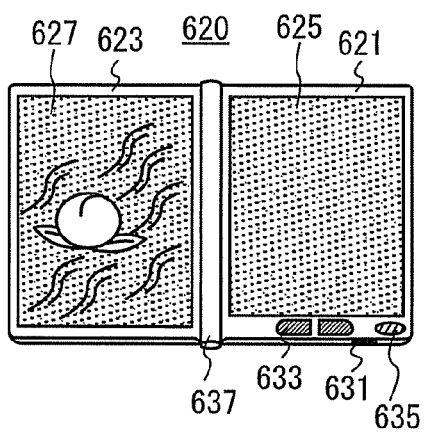

FIG. 10C illustrates an e-book reader 620 including electronic paper. The e-book reader 620 includes two housings 621 and 623. The housing 621 and the housing 623 include a display portion 625 and a display portion 627, respectively. The housings 621 and 623 are combined with each other with a hinge 637 so that the e-book reader 620 can be opened and closed with the hinge 637 used as an axis. The housing 621 includes a power button 631, operation keys 633, a speaker 635, and the like. The light-emitting device in one embodiment of the present invention is used for at least one of the display portions 625 and 627. The light-emitting device in one embodiment of the present invention has low driving voltage; thus, by the application of the light-emitting device in one embodiment of the present invention, an e-book reader with lower power consumption can be obtained.

FIG. 10D illustrates a cellular phone, which includes two housings 640 and 641. Further, the housings 640 and 641 which are developed as illustrated in FIG. 10D can overlap with each other by sliding; thus, the size of the cellular phone can be decreased, which makes the cellular phone suitable for being carried. The housing 641 includes a display panel 642, a speaker 643, a microphone 644, a pointing device 646, a camera lens 647, an external connection terminal 648, and the like. The housing 640 includes a solar cell 649 for storing electricity in the cellular phone, an external memory slot 651, and the like. The display panel 642 has a touch panel function. A plurality of operation keys 645 which are displayed as images are indicated by dashed lines in FIG. 10D. Furthermore, an antenna is incorporated in the housing 641. The light-emitting device in one embodiment of the present invention can be applied to the display panel 642. The light-emitting device in one embodiment of the present invention has low driving voltage; thus, by the application of the light-emitting device in one embodiment of the present invention, a cellular phone with lower power consumption can be obtained.

FIG. 10E illustrates a digital camera, which includes a main body 661, a display portion 667, an eyepiece portion 663, an operation switch 664, a display portion 665, a battery 666, and the like. The light-emitting device in one embodiment of the present invention can be applied to the display portion 665. The light-emitting device in one embodiment of the present invention has low driving voltage; thus, by the application of the light-emitting device in one embodiment of the present invention, a digital camera with lower power consumption can be obtained.

Figure 10F:
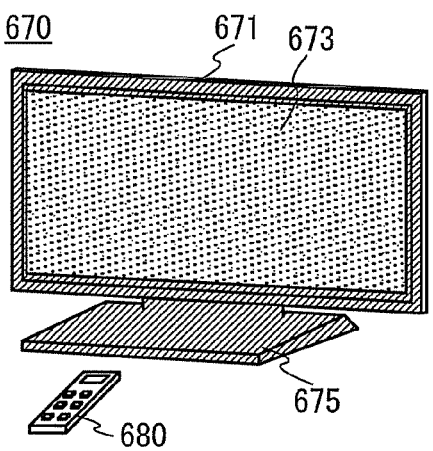

FIG. 10F illustrates a television set 670, which includes a housing 671, a display portion 673, a stand 675, and the like. The television set 670 can be operated with an operation switch of the housing 671 or a remote control 680. The light-emitting device in one embodiment of the present invention can be applied to the display portion 673. The light-emitting device in one embodiment of the present invention has low driving voltage; thus, by the application of the light-emitting device in one embodiment of the present invention, a television set with lower power consumption can be obtained.

As described above, the applicable range of the light-emitting device in one embodiment of the present invention is so wide that the light-emitting device can be applied to electronic devices in a variety of fields. With the use of the light-emitting device in one embodiment of the present invention, an electronic device with lower power consumption can be obtained.

Note that this embodiment can be combined with any of the other embodiments as appropriate.

This application is based on Japanese Patent Application serial No. 2010-094807 filed with Japan Patent Office on Apr. 16, 2010, the entire contents of which are hereby incorporated by reference.

What is claimed is:

1. A light-emitting device comprising:
a substrate for transmitting visible light;
a conductive layer for blocking visible light over the substrate;
a color filter layer including an opening over the conductive layer;
a first electrode layer for transmitting visible light over the color filter layer, the first electrode layer connected to the conductive layer in the opening;
an insulating partition for blocking visible light over the first electrode layer and overlapping with the opening;
an electroluminescence layer over the first electrode layer and the insulating partition; and
a second electrode layer over the electroluminescence layer,
wherein the electroluminescence layer includes a layer containing a donor substance and an acceptor substance and a layer containing a light-emitting organic compound,
wherein the conductive layer for blocking visible light comprises a metal layer,
wherein in a region exposed in the opening of the color filter layer, the metal layer is not provided between the substrate and the first electrode layer,
wherein a region of the electroluminescence layer which overlaps with the insulating partition and the opening of the color filter emits light when a voltage is applied between the first electrode layer and the second electrode layer, and
wherein the insulating partition is configured to block the light emitted from the region of the electroluminescence layer.

2. The light-emitting device according to claim 1, wherein the electroluminescence layer includes a first layer including a layer containing a light-emitting organic compound, a second layer including a layer containing a light-emitting organic compound, and an intermediate layer provided between the first layer and the second layer.

3. The light-emitting device according to claim 2, wherein the intermediate layer contains the donor substance and the acceptor substance.

4. The light-emitting device according to claim 1, wherein the donor substance is an alkali metal, an alkaline earth metal, a rare earth metal, an alkali metal compound, an alkaline earth metal compound, or a rare earth metal compound.

5. An electronic device comprising the light-emitting device according to claim 1.

6. The light-emitting device according to claim 1, further comprising an overcoat layer between the color filter layer and the first electrode, and
wherein the color filter layer is not in contact with the first electrode.

7. A light-emitting device comprising:
a substrate for transmitting visible light;
a transistor comprising a gate electrode over the substrate, a gate insulating layer over the gate electrode, a semiconductor layer over the gate insulating layer, and a source electrode and a drain electrode over the semiconductor layer;
an insulating layer over and in contact with the semiconductor layer, the source electrode, the drain electrode and the gate insulating layer;
a color filter layer including an opening over one of the source electrode and the drain electrode layer;
a first electrode layer for transmitting visible light over the color filter layer;
an insulating partition for blocking visible light over the first electrode layer and overlapping with the opening;
an electroluminescence layer over the first electrode layer and the insulating partition; and
a second electrode layer over the electroluminescence layer,
wherein each of the source electrode and the drain electrode comprises a metal layer which blocks visible light and in contact with the gate insulating layer,
wherein the insulating layer has an opening in the opening of the color filter layer,
wherein the first electrode layer is in contact with the one of the source electrode and the drain electrode in the opening of the insulating layer,
wherein in a region exposed in the opening of the color filter layer, the metal layer is not provided between the substrate and the first electrode,
wherein the electroluminescence layer includes a layer containing a donor substance and an acceptor substance and a layer containing a light-emitting organic compound,
wherein a region of the electroluminescence layer which overlaps with the insulating partition and the opening of the color filter emits light when a voltage is applied between the first electrode layer and the second electrode layer,
and wherein the insulating partition is configured to block the light emitted from the region of the electroluminescence layer.

8. The light-emitting device according to claim 7, wherein the electroluminescence layer includes a first layer including a layer containing a light-emitting organic compound, a second layer including a layer containing a light-emitting organic compound, and an intermediate layer provided between the first layer and the second layer.

9. The light-emitting device according to claim 8, wherein the intermediate layer contains the donor substance and the acceptor substance.

10. The light-emitting device according to claim 7, wherein the donor substance is an alkali metal, an alkaline earth metal, a rare earth metal, an alkali metal compound, an alkaline earth metal compound, or a rare earth metal compound.

11. An electronic device comprising the light-emitting device according to claim 7.

12. The light-emitting device according to claim 7,
wherein the semiconductor layer is an oxide semiconductor layer, and
wherein the insulating layer contains oxygen.

* * * * *